United States Patent [19]
Batchilo et al.

[11] Patent Number: 5,901,068
[45] Date of Patent: May 4, 1999

[54] COMPUTER BASED SYSTEM FOR DISPLAYING IN FULL MOTION LINKED CONCEPT COMPONENTS FOR PRODUCING SELECTED TECHNICAL RESULTS

[75] Inventors: Leonid S. Batchilo, Arlington; Valery M. Tsourikov, Boston, both of Mass.; Vitaly N. Glazunov, Moscow, Russian Federation; Alexandre I. Kirkovski; Alexandre N. Korzoun, both of Minsk, Belarus

[73] Assignee: Invention Machine Corporation, Boston, Mass.

[21] Appl. No.: 08/946,395

[22] Filed: Oct. 7, 1997

[51] Int. Cl.$^6$ ..................................................... G06F 17/50
[52] U.S. Cl. ........................... 364/512; 364/488; 364/489; 364/578
[58] Field of Search ................. 364/468.01, 468.03, 364/488–491, 512, 578; 345/419, 440, 441, 961, 964

[56] References Cited

U.S. PATENT DOCUMENTS

| | | | |
|---|---|---|---|
| 4,965,743 | 10/1990 | Malin et al. | 706/45 |
| 4,967,368 | 10/1990 | Bolling et al. | 364/513 |
| 5,006,991 | 4/1991 | Ohcoshi et al. | 364/474.2 |
| 5,016,204 | 5/1991 | Simoudis et al. | 364/578 |
| 5,544,067 | 8/1996 | Rostoker et al. | 364/489 |
| 5,623,418 | 4/1997 | Rostoker et al. | 364/489 |

*Primary Examiner*—Kevin J. Teska
*Assistant Examiner*—Hani M. Kazimi
*Attorney, Agent, or Firm*—Edward Dreyfus, Esq.

[57] ABSTRACT

A digital computer-based concept engineering system (CES) that includes a data base of concept components (Y=f(x)) of which includes input, output and control parameters, text descriptions, and full motion graphics of a device or system that functions as y=f(x) of a device. The CES provides three problem-solving modes, including direct linking automatically to produce full-motion graphical representations of $x_2 \rightarrow f_2 43 \ x_1 43 \ f_1 \rightarrow y$ and a control-linking mode to produce full-motion graphical representations of concept components that control parameters of y=f(x, a, b, c). The CES forms new and useful combinations of concept components into a unique concept engineering system, which produces new or improved technical results. Full-motion graphics of unique combinations of concept components stimulate the user to generate creative ideas for technical problem-solving and design.

17 Claims, 32 Drawing Sheets

Flow chart: Direct linking mode started from define user C.C.

Flow chart: Problem solution. Control linking mode started from direct access.

5,901,068

COMPUTER BASED SYSTEM FOR DISPLAYING IN FULL MOTION LINKED CONCEPT COMPONENTS FOR PRODUCING SELECTED TECHNICAL RESULTS

BACKGROUND

The present invention relates generally to engineering problem solving and design information processing systems and more particularly to computer based systems for aiding engineers, scientists and the like to have a greater understanding of the products, processes, or machines they wish to improve and the technical problems related thereto that they wish to solve.

Great advancements have been made in the fields commonly known as computer aided design (CAD) and computer aided engineering (CAE). These computer based systems enable the designer to create detailed images and print-outs of the product, process or machine he/she is designing or improving. With CAD, the designer can try many new designs or modifications of subsystems and components quickly and view the modified products immediately on the monitor or print-out. The CAD system also generates virtual 3-D images of the product or machine, enables in-space rotation of the product image and zoom through the product image interior.

Although CAD systems are a great designer tool for trying design changes quickly, they do not otherwise aid the designer in the evaluation and solving of technical engineering problems or conceiving new products or processes that provide new functional performance or the same functional performance with completely different engineering approaches. Accordingly, there has arisen a relatively new area of computer based engineering tools known as concept engineering computer based systems. These systems serve to increase the designer's inventive and creative abilities in solving engineering and scientific operational or functional problems and, in the course of such problem solving, induce the designer to invent new structural and functional concepts applicable to his/her design goals.

One such concept engineering computer based system is the TECHOPTIMIZER™ software sold by Invention Machine Corporation of Boston, Mass. and described in pending U.S. patent application Ser. No. 08/822,314, filed Nov. 12, 1996 that comprises a knowledge and logic based information processing system for generating conceptual engineering system definition and problem analyses. This system automates the process of originating the statement of the most important technical problems for elimination of components or harmful inter-actions between components of the object system being analyzed or redesigned.

Another concept engineering computer based system is the Invention Machine™ LAB™ Software sold by Invention Machine Corporation of Boston, Mass., that comprises a knowledge and logic based system that generates concepts and recommendations for solving engineering problems at the conceptual level. Various inventive rules or procedures are included and certain ones are selected and presented to the user for consideration in solving the user's current session problem. This system applies to all fields of physical science and aids the engineer by solving engineering contradictions to reduce the tendency of user applied engineering trade-offs. The system includes a large data base of physical, geometric, and chemical effects used in the past to solve other engineering problems. Selected ones of the effects are presented to the user for consideration by the user as potential solutions to his/her current problem session. The system also includes a technology evolution and prediction capability that aids the user in understanding the dynamics of his/her product evolution and the logical next or future generation of the product or its function. This stimulates the user to think forward and extrapolate the dynamics of the technology life cycle and originate the next generation of technology.

Although the above mentioned computer based concept engineering systems have experienced much acceptance by the technical community, there is still a need for alternate methods of concept engineering that enable the user to rapidly and comprehensively understand the nature of the technical result he/she wishes to achieve and the structure and function of various engineering devices that, if linked together, can produce the desired technical result.

There is also a need in concept engineering and design systems for the computer based system to rapidly, effectively and visually present to the user the capability of searching for the precise technical result he/she desires and displaying to the user in brief but comprehensive form an engineering system or device, what the physical effect is, and how the device can produce the desired technical result. The problem here is generating for the user information in such a way that enables the user to obtain and understand substantially immediately, e.g. within one or two minutes, the technical problem the user must address to achieve the desired technical result.

In addition, there is a need to present to the user/designer for consideration various subsystems that either control or affect the parametric environment for the engineering device under consideration or that can function as a series of input-output stages for the system representation that produces the desired technical result.

SUMMARY OF EXEMPLARY EMBODIMENT OF THE INVENTION

It has been found by the present inventors that the designer's creative capabilities and ability to generate quickly many technical ideas is greatly enhanced when the technical designer can view full motion graphics of the physical effect system that produces the desired technical result as well as the system that can comprise one or more inputs to the engineering system under consideration. According to one aspect and objective of the system according to the present invention, the concept engineering system includes a data base of many individual systems each of which is associated with an engineering system or device for responding to a predefined input action or cause and producing an output or technical result in accordance with some physical laws or rules herein referred to as a physical effect. Unlike conventional systems, the system according the present invention includes a data base that not only includes word descriptions of the physical effects, but also includes a macro graphic of what the physical effect is and a second micro graphic of how the physical effect device produces the technical result. In addition, both the macro and micro graphics can show full motion for 5 to 10 seconds at the option of and under the control of the user. Further, the physical effect data base according to the present invention includes mathematical equations that indicate the parameters, and certain ones of these parameters are selected by the present system to be control parameters for a control linking mode more fully described below.

Another object and aspect of the present invention is to provide a new and improved computer based system which meets the needs of the user as described above and presents a quick and powerful way for the user to define his/her technical problem and present suggestions of engineering systems that can conceptually solve the problems or improve the technical result desired. It is first necessary to understand that concept engineering systems or engineering concept components can be represented and analyzed as an input/output device. This representation can be expressed mathematically as Y=f(x), or an output result (y) is a function or physical effect (f) of an input action or cause (x). An example of this for a photocell device is: the current (y) from a photocell is a function (f) of the input light intensity (x) absorbed by the photocell. The function (f) comprises the mathematical equations physically inherent in the photocell device.

This can be represented by:

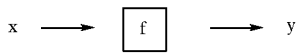

where x=light intensity f=the mathematical function of the photocell y=current

Often the designer may have the problem wherein the system does not have a light source available as an input to the engineering device (photocell). Accordingly, the designer needs to decide what other engineering device to add to the system that can generate the input (light) to the photocell based on what actions or inputs are available to the designer. This can be represented as:

$$y=f(x_1)$$

$$x_1=f_2(x_2)$$

Where:

$x_2$ is some other cause or input $f_2$ is some other physical effect device $x_1$ is light f is Photocell y is Current.

A further extension of the required stages where three devices are arranged such that the output of one serves as the input of the next can be represented as:

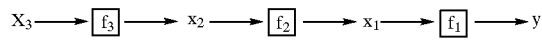

Accordingly, one aspect and objective of the information processing system according to one embodiment of the present invention is a computer based system capable of analyzing engineering systems and automatically searching for and displaying the combination of two or more physical effects which the computer based system automatically arranges to serially interact with one another and which will improve or produce the desired technical result Y. This process routine is termed direct linking, as the system searches for outputs that can serve as inputs to successive stages of functional devices.

An alternate method of analyzing engineering systems in an exemplary embodiment of the present invention includes representing the device that, embodies the physical effect and modifying the technical result by adjusting the control parameters of the device.

This can be represented as:

$$Y=f(x, a, b, c)$$

Where

Y=Technical result

X=input action a,b,c=separate parameters of the mathematical equation f such as temperature, pressure, frequency, etc.

Another aspect and objective of the present invention is to provide an information processing system that displays the engineering object and its physical effect that produces the desired technical result, searches for and displays combinations of other physical effect devices that can produce outputs that control specific control parameters of the engineering object.

In one example of a system according to the principles of the present invention, the computer based system includes at least one database:

(1) a Technical Results (Y) Database, (2A) a word description Physical Effects (f) Database with word, equation and table description of each physical effect, each entry includes a number of fields, further described below, the includes words including the input field, output or technical result field, synonym field, mathematical equation field, etc.

(2B) a Graphics Physical Effects (f) (still and full motion) Database with a macro (what) and micro (how) presentation level on each physical effect, and (3) a set of physical rules, synonym expressions, and links between stored database entries.

The computer based system includes two main stages, a problem statement stage and an effect based solution stage, although the user can move between these two stages at will. In the problem statement stage, the user can select one of three ways to enter a problem statement. The user can: (1) select the Technical Result statement in which case the Technical Result (TR) or output field data or contents is displayed and the user simply selects the TR he/she wants to obtain, the problem becomes how to obtain the selected TR, or (2) select a Find box which presents the user with the option of entering one or more key words or combination of words, the problem becomes how to obtain the effect(s) of a system that includes a physical effect that includes the key words entered by the user, or (3) select a define option which enables the user to select from the data base his or her own X, Y concept component and control parameters from prompted lists. The problem then is how to improve or control the described user concept component.

Once the problem statement is entered, the user can then access and operate the system in three alternate problem-solving modes: a direct linking mode, a control linking mode, or a browse mode.

When the browse mode is accessed for the TR problem statement procedures, the system displays in one portion of the monitor all the Y entries or Technical Results fields contents entries in some order, such as alphabetical order. The user can scroll through these entries and click (select) the one that is likely to or may represent the output of his/her design task. Selecting a particular entry may yield one, two or more sublevels or entries affording the user a greater degree of selection control. The selection of the lowest level technical result in that chain brings up a display under the selected TR the engineering devices or concept component from the data base that have the selected TR as an output.

The user can point the cursor EG, arrow) to any displayed concept component and the computer based system will automatically show a short, e.g., 5-second, still macro graphic of that physical effect device. If the user clicks on that or any of the listed concept components, then there will be displayed on the monitor a word description and associated Macro and Micro Graphic of the selected component that has an output (Y), i.e. the same output as the selected technical result. The word description includes an explanation of the effect, tables, formulas (stating control parameters), structural and operating conditions, outside references and other information as desired. The graphic, initially a single frame, includes a start button which when selected starts a short, e.g., 5–10 second, full motion macro operation of the engineering system/device displayed. It also includes a detail button, which when selected, displays a second full motion micro graphics showing how the physical effect produces the Technical Result. This micro level graphic also includes a 5–10 second motion start button. In this way, the user's understanding is rapidly and greatly raised through motion graphics, detailed formula, and word descriptions as to what the physical effect is and how his/her selected Technical Result is achieved. This raised level of understanding leads to the user rapidly generating new ideas for solving or achieving Engineering system design improvements.

The user can alternately select or move to a direct linking mode in which case the Technical Result or output field entries are displayed as described above for the browse mode. Again the user selects a particular technical result of interest. The system then automatically displays a list of various engineering systems with the output (Y) which is the same as the technical result (Y) selected by the user. In addition, it displays the various inputs to each engineering system/device that produced the specific Y result and it will also link to and list other engineering systems/devices that have outputs $(X_n)$ that can serve as inputs to the engineering system/device that produced Y.

The rule for and display on the monitor can be represented as:

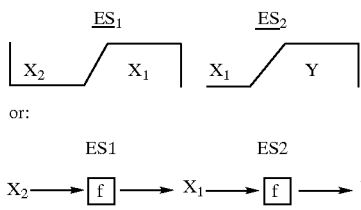

Where Y is the technical result selected by the user as mentioned above. Note the computer system automatically searches for and selects the input engineering system to serve as input to $ES_2$ that produces Y.

In addition, macro graphic representations of $ES_1$ and $ES_2$ are displayed with full motion capability as described above.

In the event a third, intermediary, engineering system is required with mating input/output so that the last device will properly generate Y, then the computer system automatically searches for and inserts it. This action is represented as:

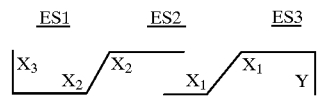

or:

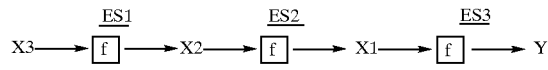

Therefore, the computer system according to an exemplary embodiment of the invention implements a direct linking routine to present the user with new combinations of two or three interactive engineering systems that can produce the designer's desired technical result and simultaneously display motion graphics of the physical effects involved.

In the control mode, the user again is presented with the Technical Result entries in one portion of the monitor and he/she selects a particular Technical Result (Y) of interest. In this case the word description and macro graphic of an engineering device with Y as its output are displayed on the monitor. However, the controlling parameters (a,b,c in the above mentioned example) are also listed in association with the graphic and the user can alternately select one or more of these parameters in sequence. Clicking on one parameter causes the computer system to display one, or, in sequence, a set of word descriptions and graphic representations of engineering systems that control, affect, or generate that specific parameter. All graphic displays have full motion capability as described above. Therefore, the user is presented with a unique combination of engineering devices for controlling specific parameters for optimizing or improving the output or technical result Y of the engineering system under analysis.

Other and further objects, benefits, and advantages afforded by the exemplary embodiments of the present invention will become apparent with the following detailed description when taken in view of the appended drawings in which.

FIG. 7A–D is a flow chart of the direct linking routine starting from direct access.

Figure 8A:
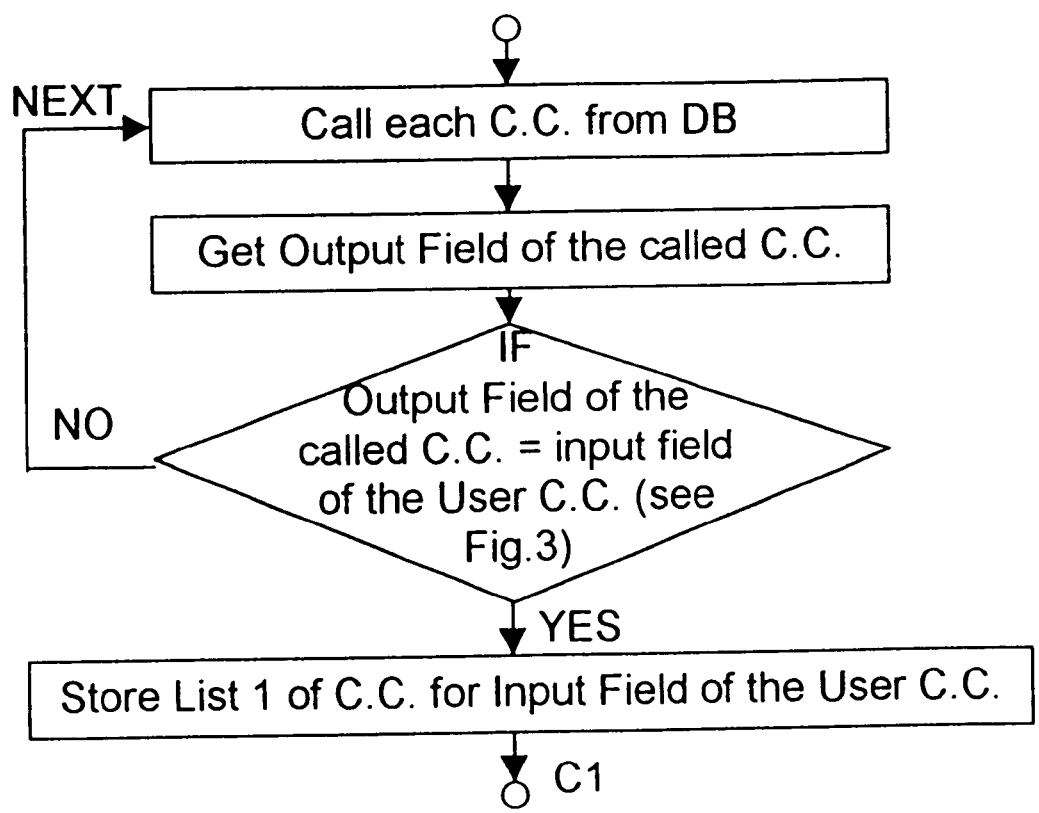
Figure 8B:
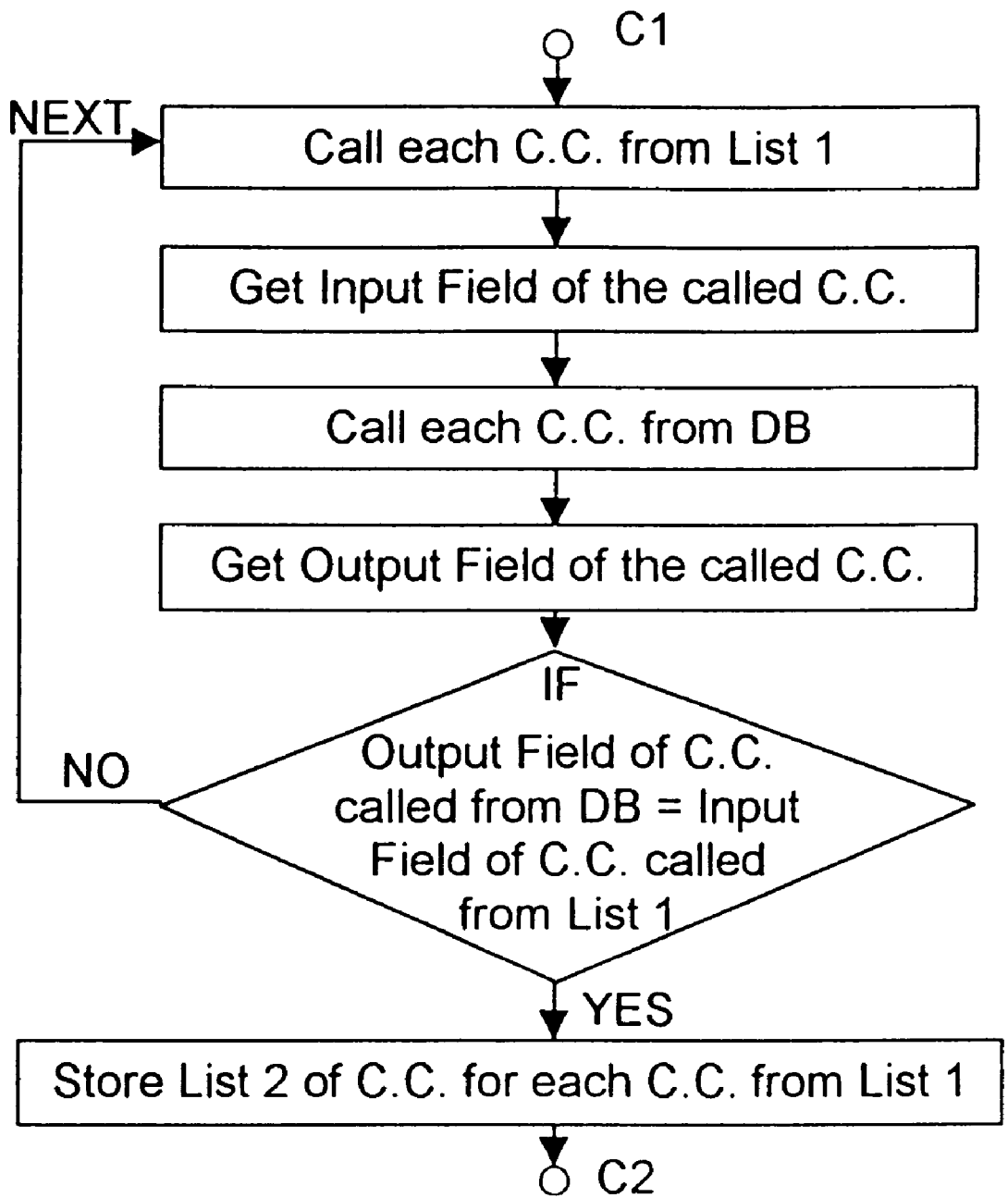
Figure 8C:
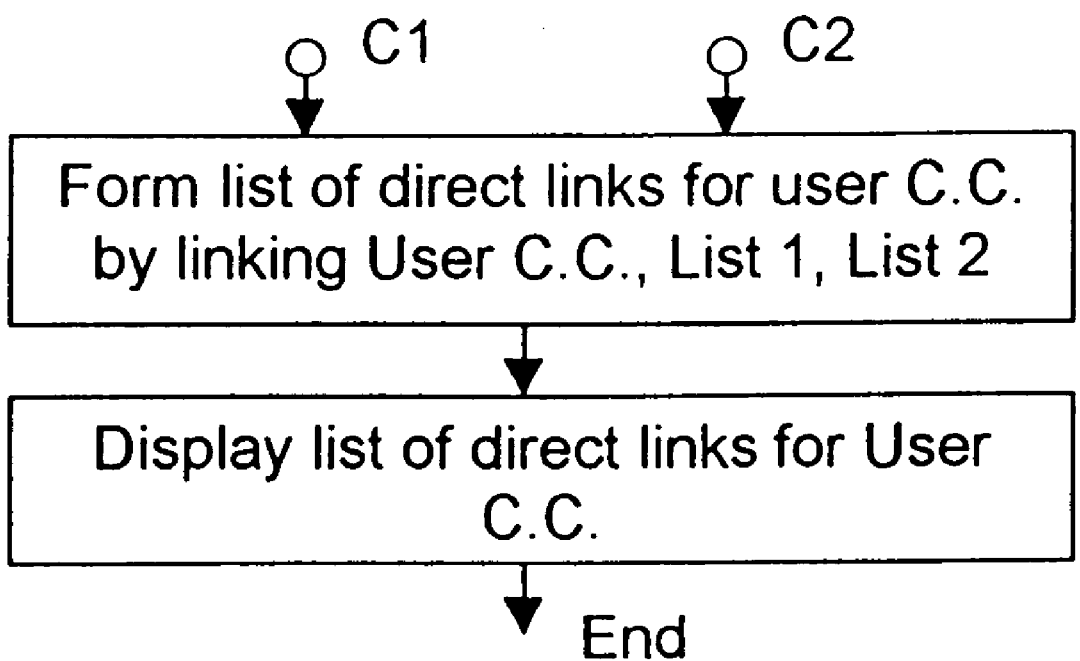

FIG. 8A–C is a flow chart of the direct linking routine starting from the define problem statement.

Figure 9A:
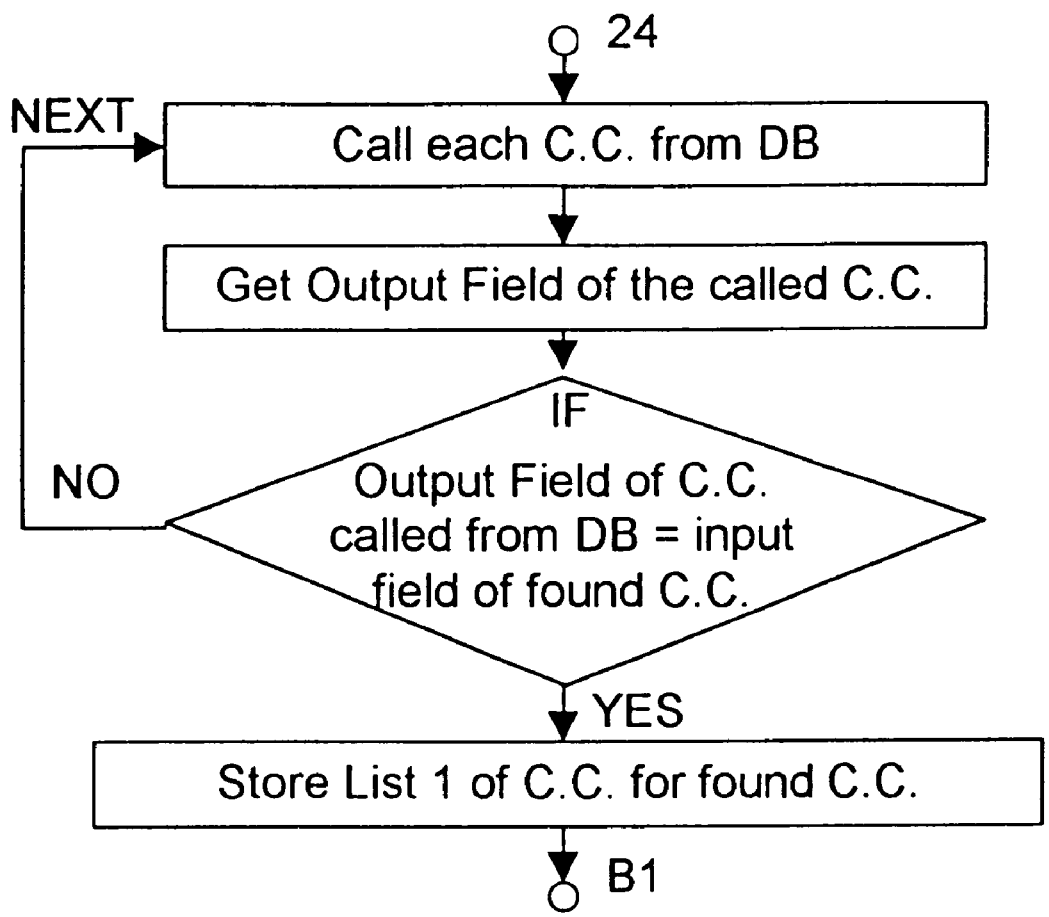
Figure 9B:
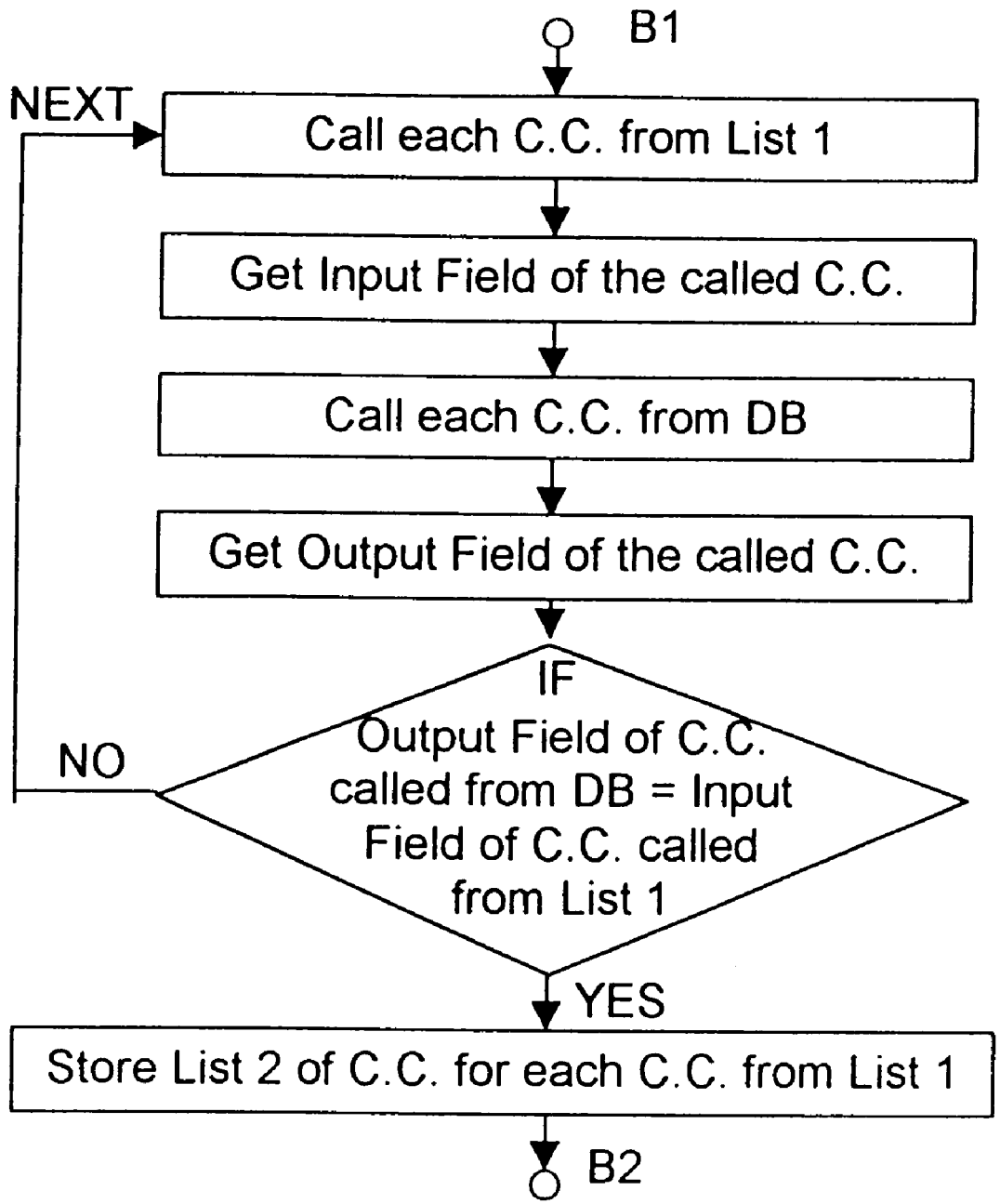
Figure 9C:
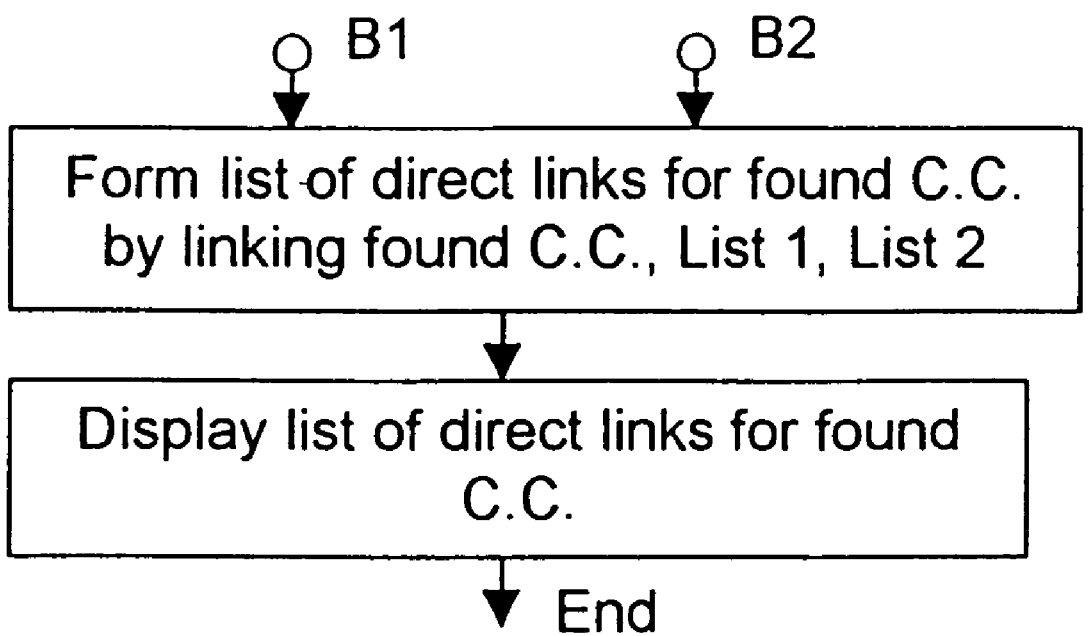

FIG. 9A–C is a flow chart of the direct linking routine starting from the find problem statement.

Figure 10:
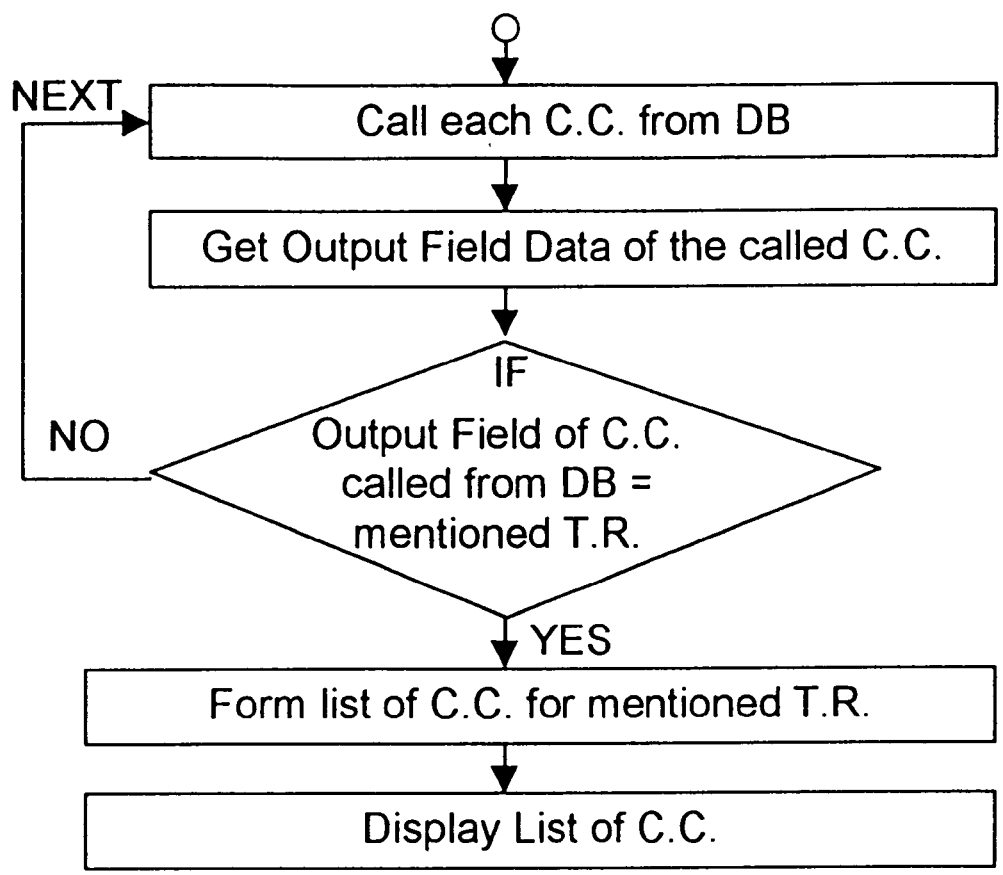

FIG. 10 is a flow chart of the browse routine starting from direct access.

Figure 11A:
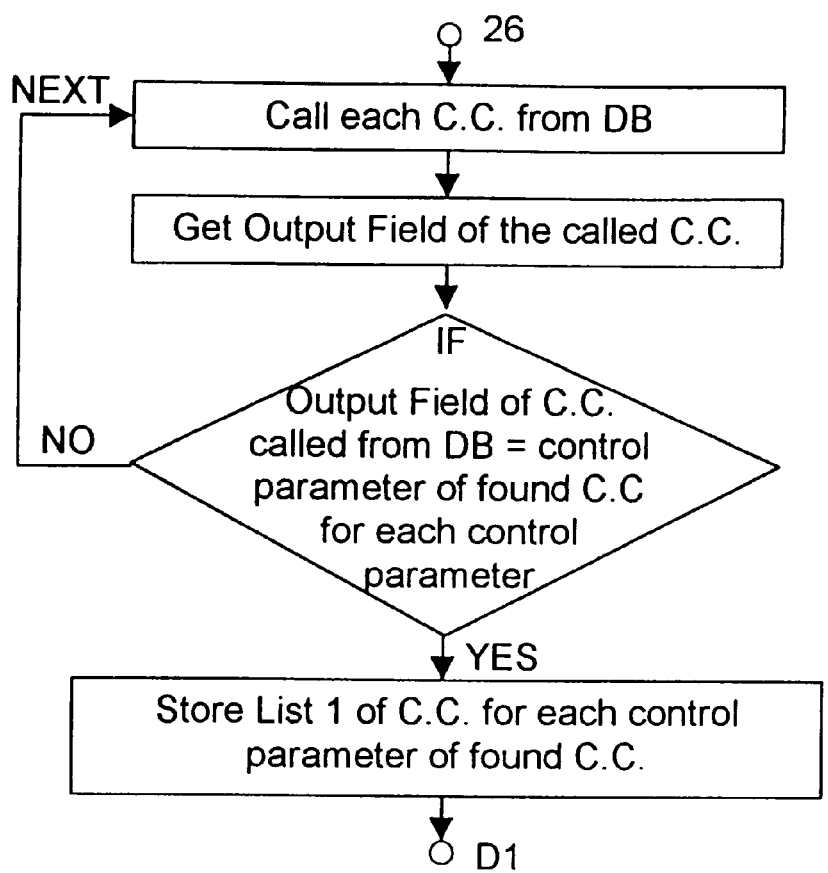
Figure 11B:
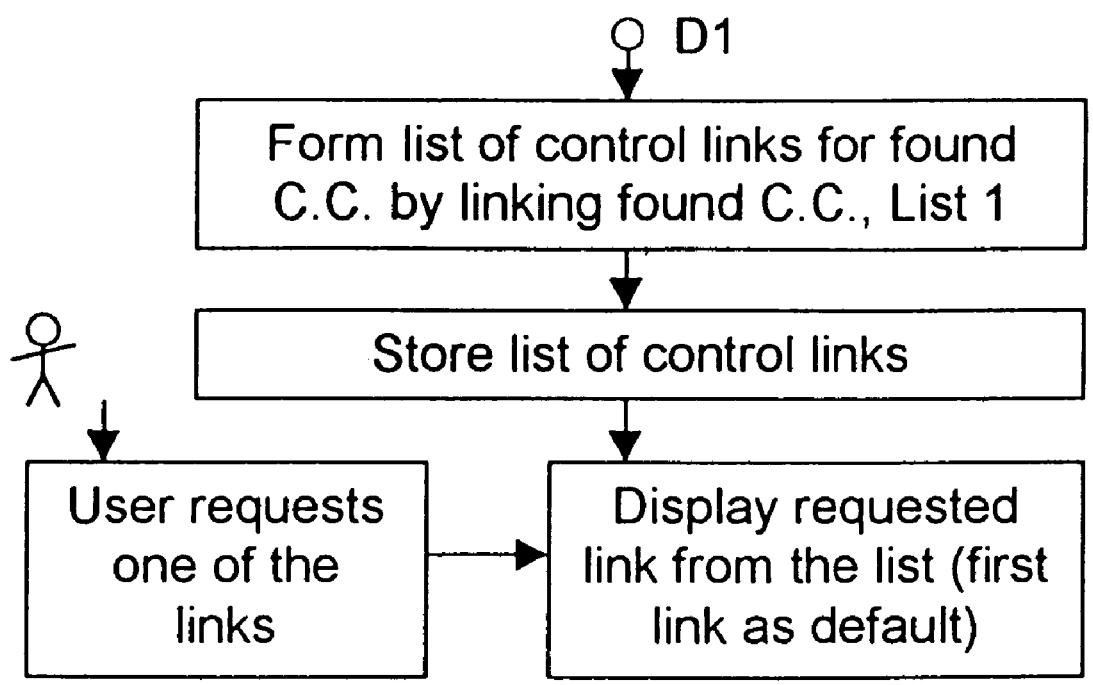

FIG. 11A–B is a flow chart of the control linking routine starting from the find problem statement.

Figure 12A:
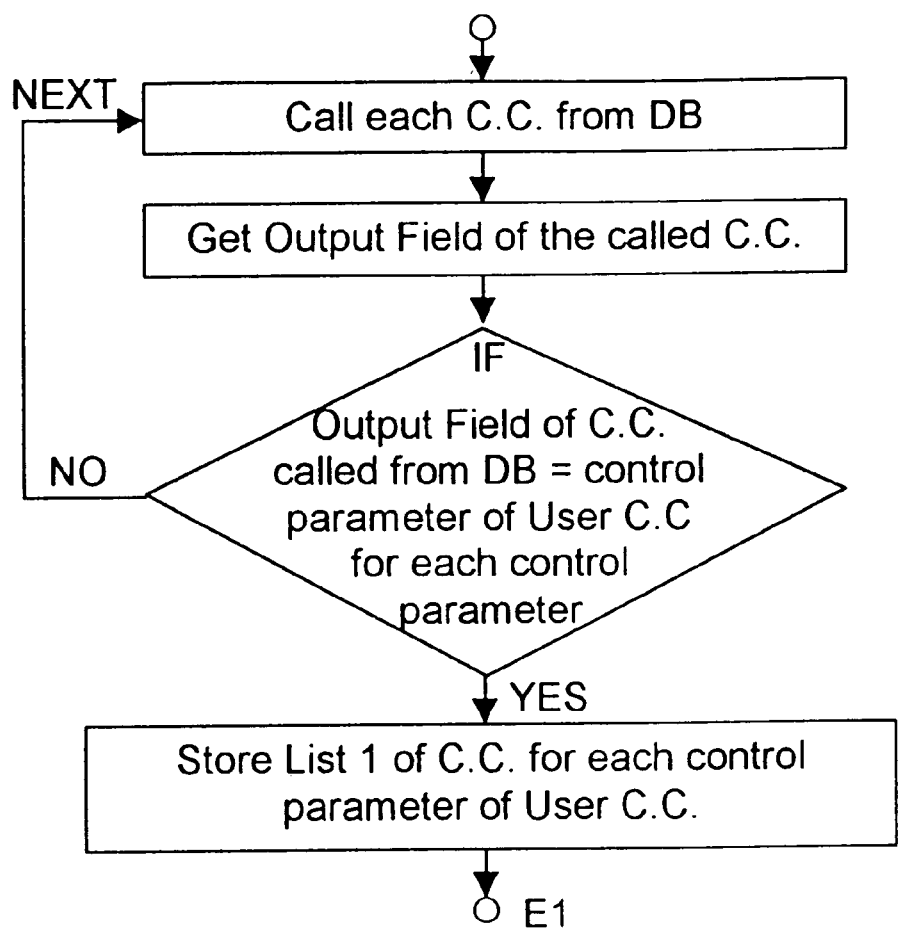
Figure 12B:
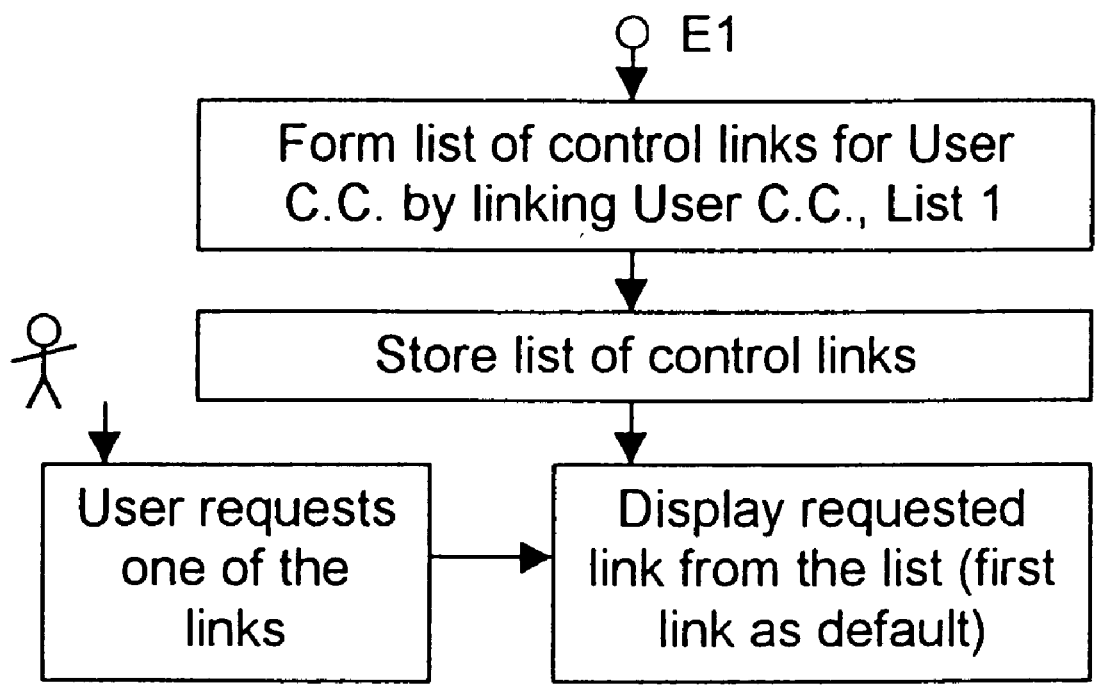

FIG. 12A–B is a flow chart of the control linking routine starting from the define problem statement.

Figure 13A:
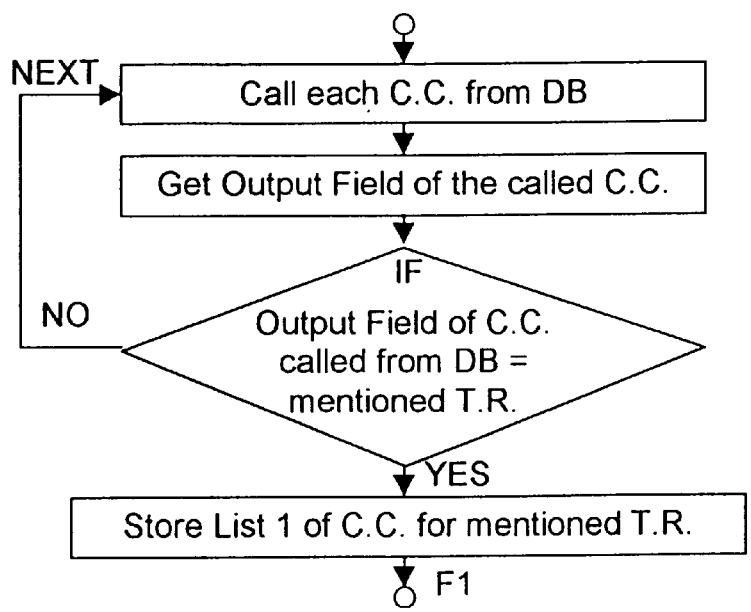
Figure 13B:
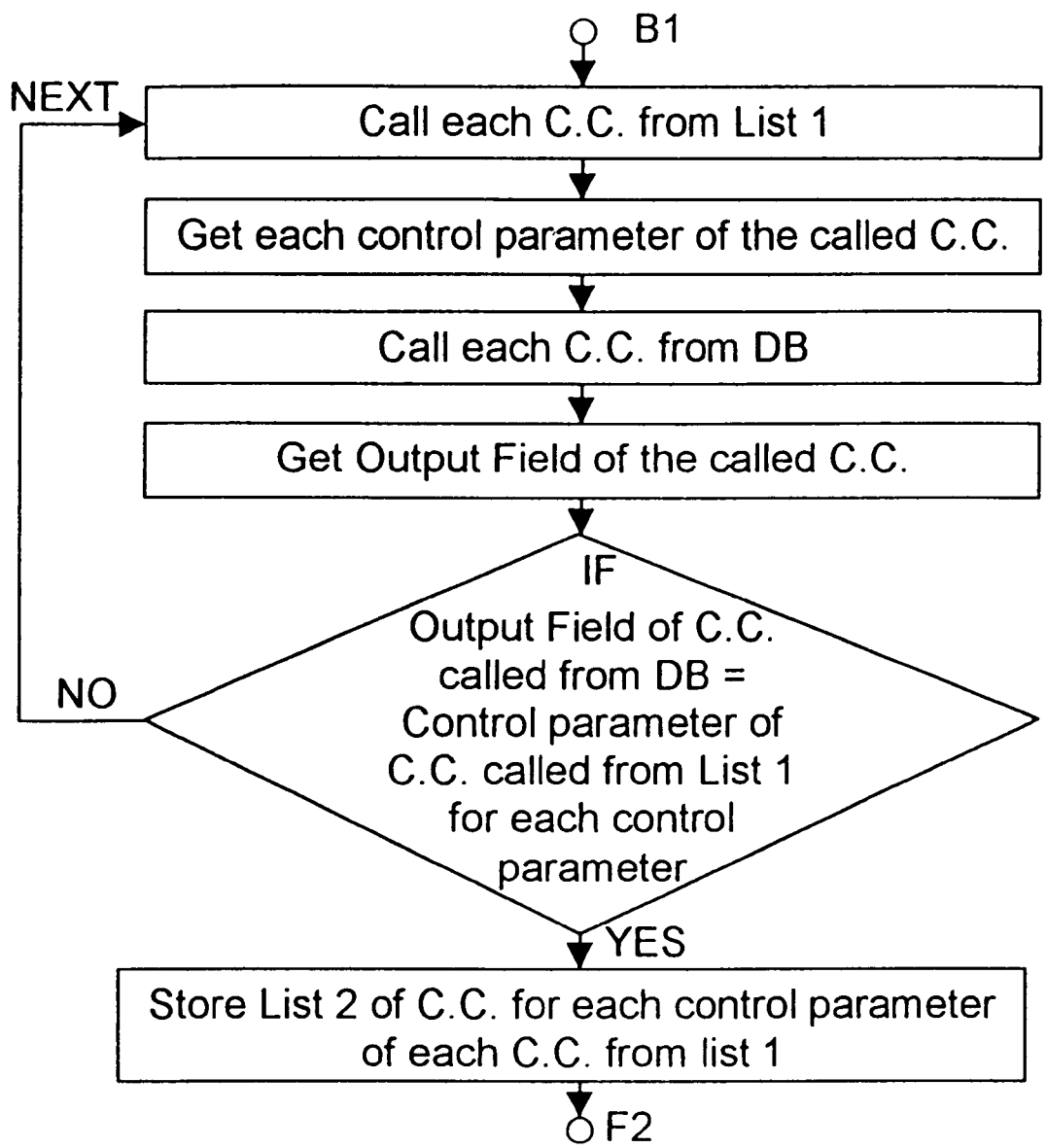
Figure 13C:
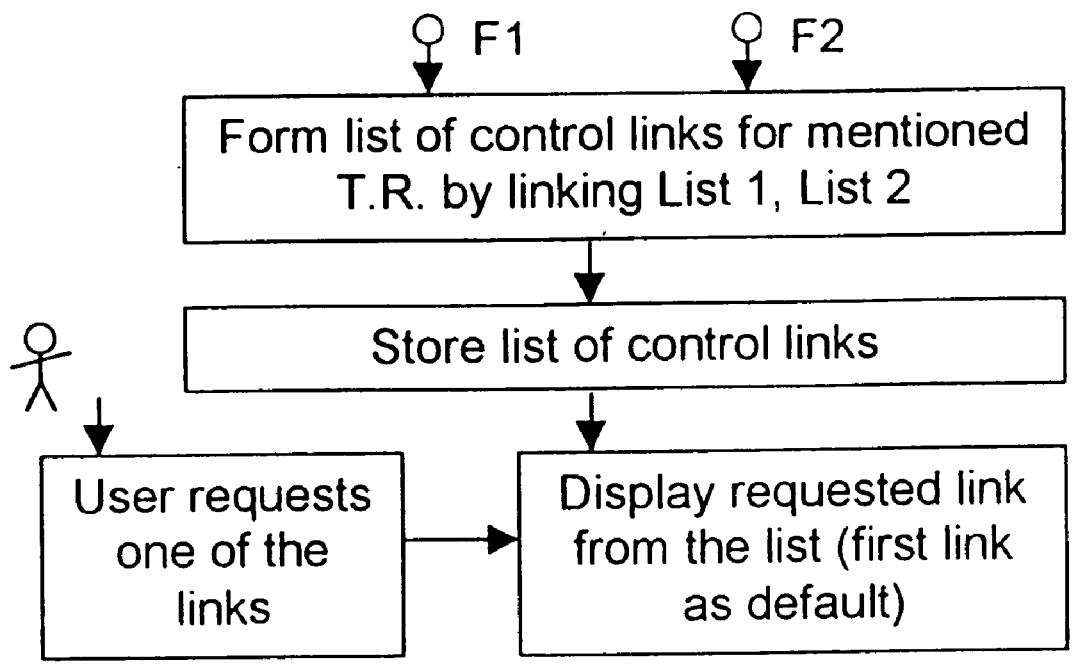

FIG. 13A–C is a flow chart of the control linking mode starting from the direct access problem statement.

Figure 14:
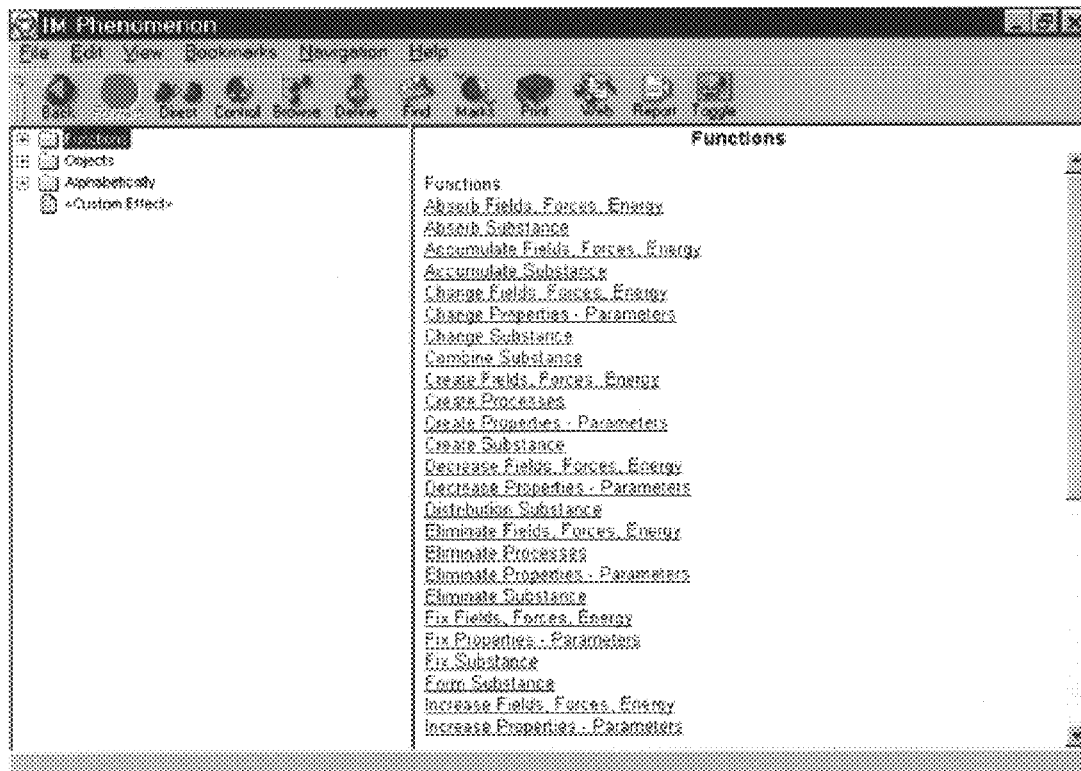

FIG. 14 is a display on session start.

Figure 15:
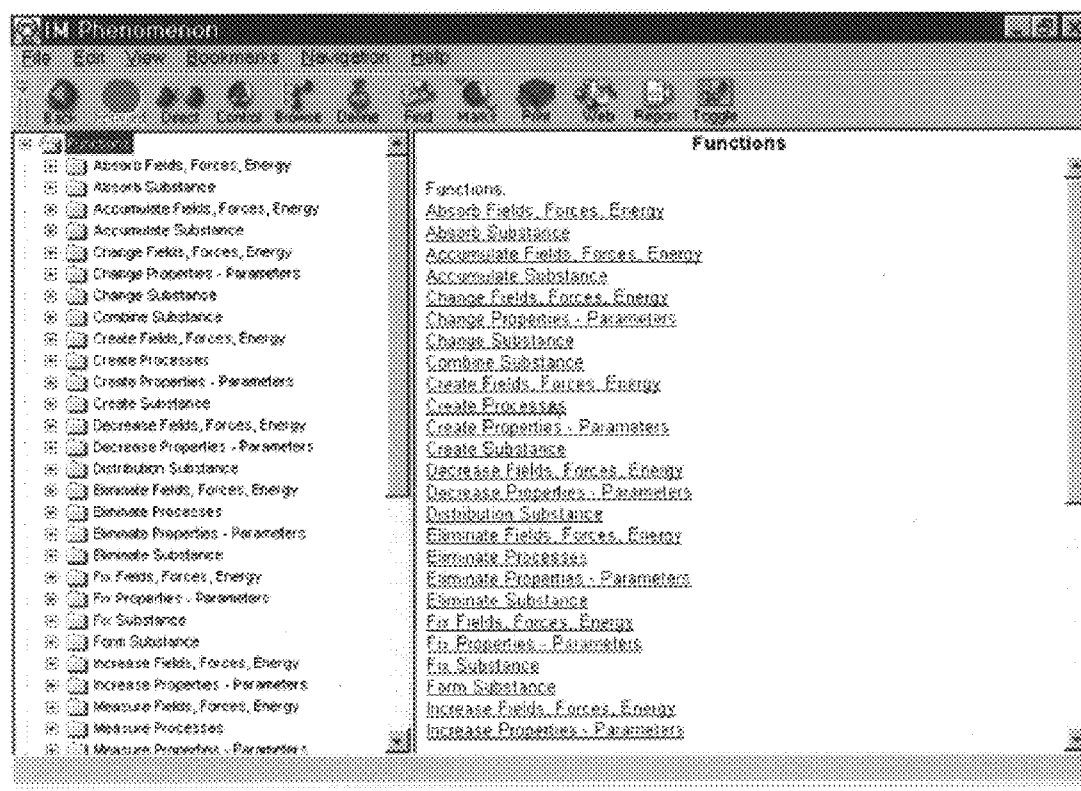

FIG. 15 is a display when function of FIG. 14 is selected.

Figure 16:
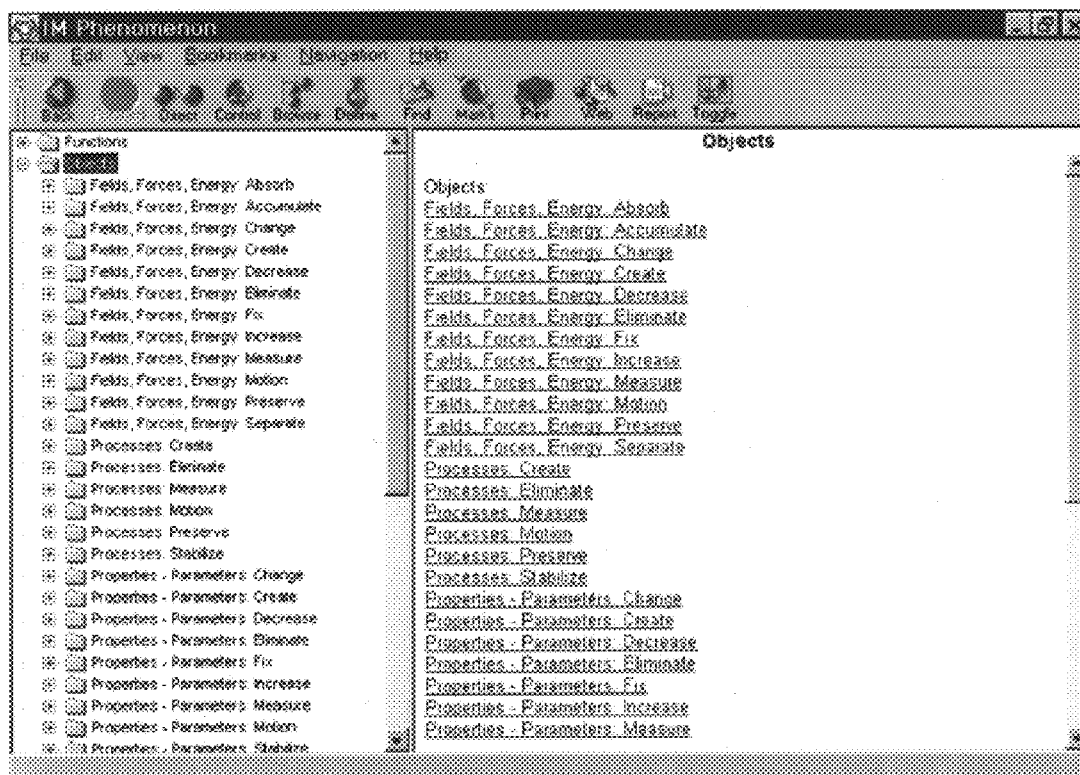

FIG. 16 is a display when objects of FIG. 14 is selected.

Figure 17:
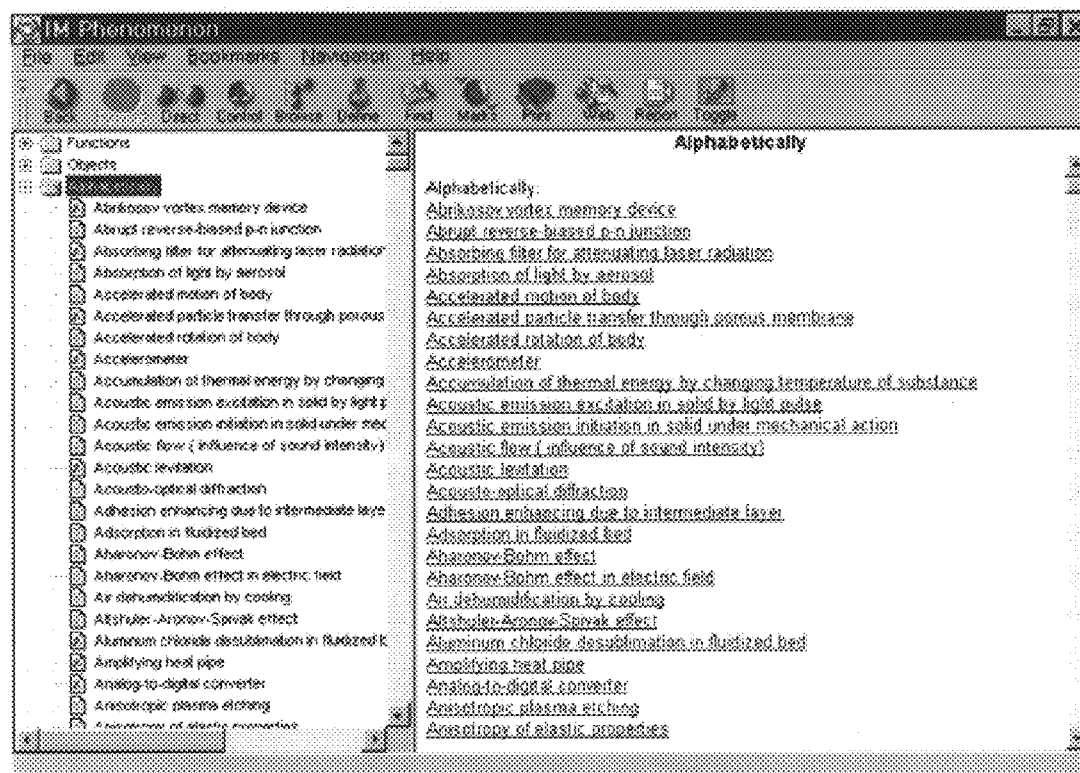

FIG. 17 is a display when alphabetically of FIG. 14 is selected.

Figure 18:
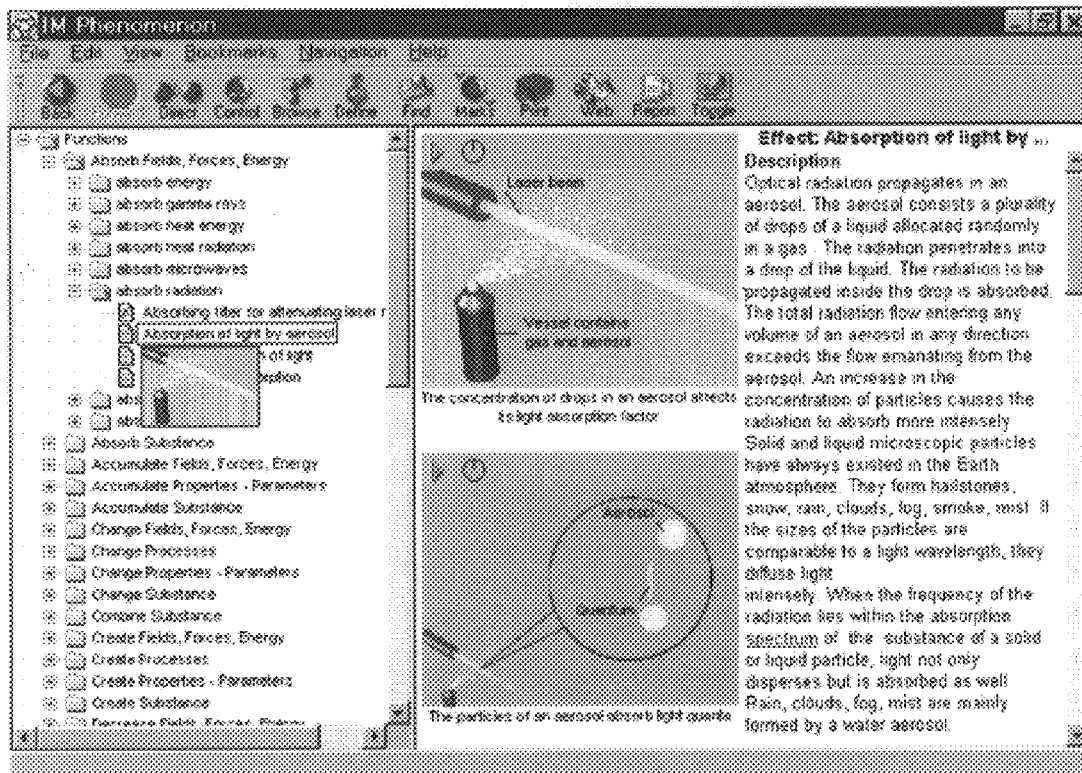

FIG. 18 is a display of a concept component including brief graphic and macro and micro fall motion graphics.

Figure 19:
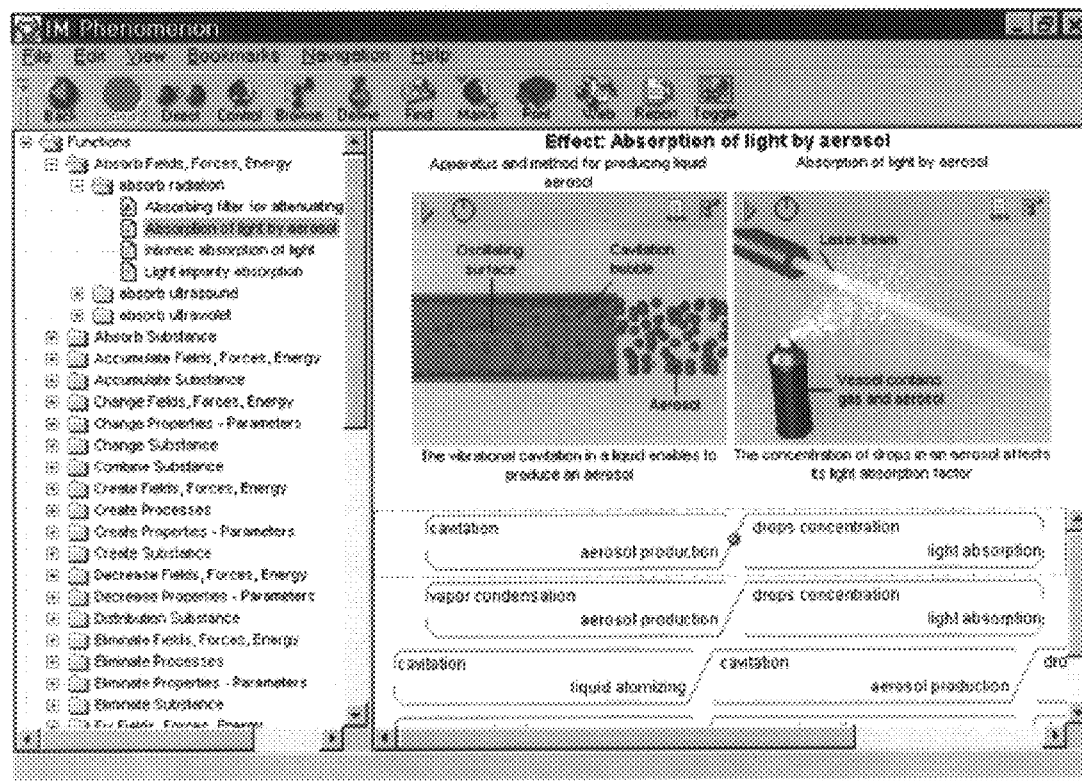

FIG. 19 is a display when FIG. 18 and direct linking is selected.

Figure 20:
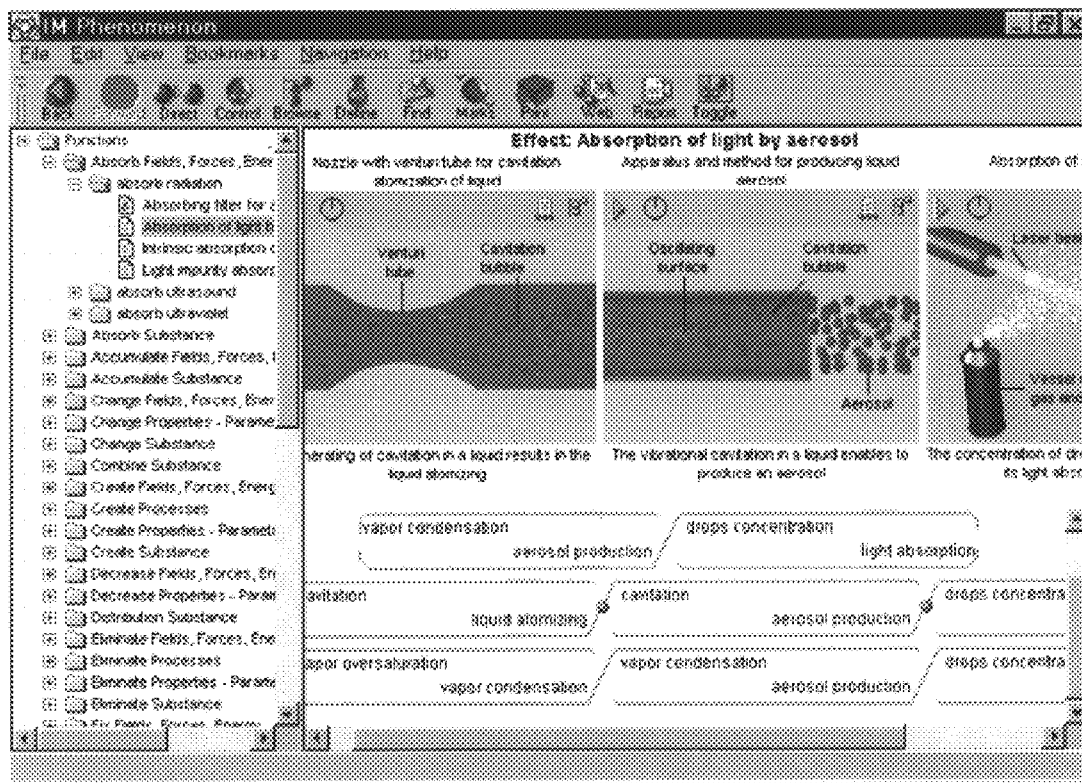

FIG. 20 is a display when the second linked combination is selected.

Figure 21:
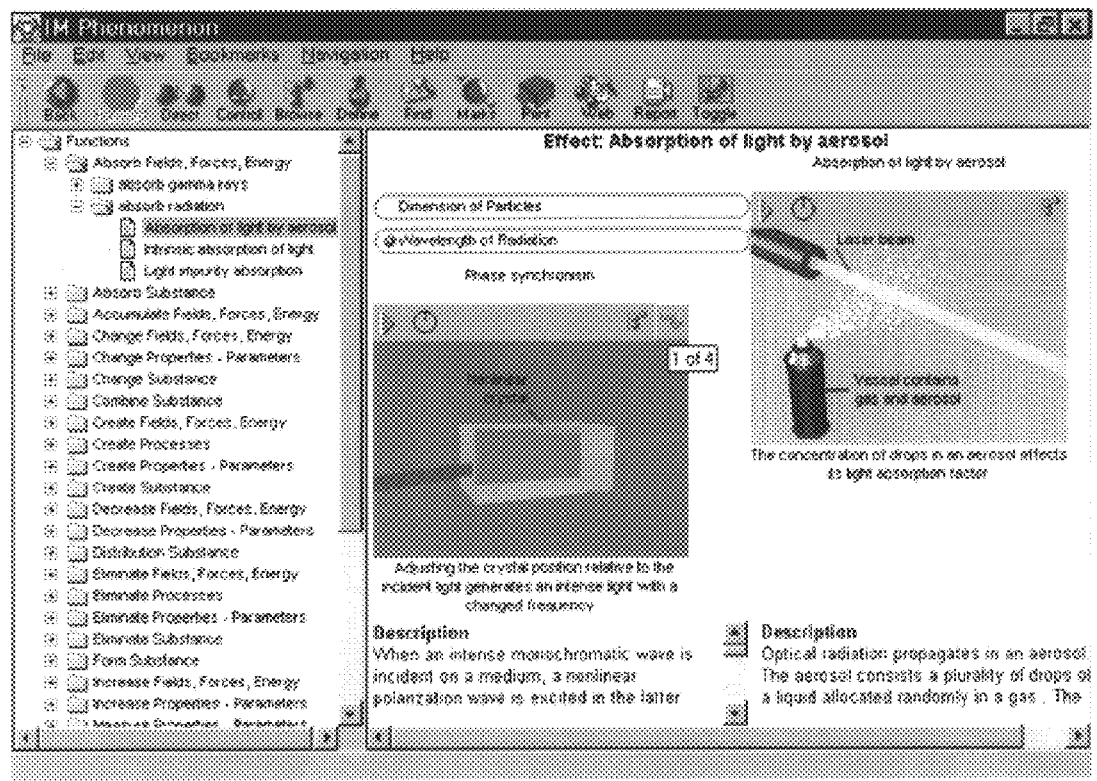

FIG. 21 is a display when control linking is selected in FIG. 14.

Figure 22:
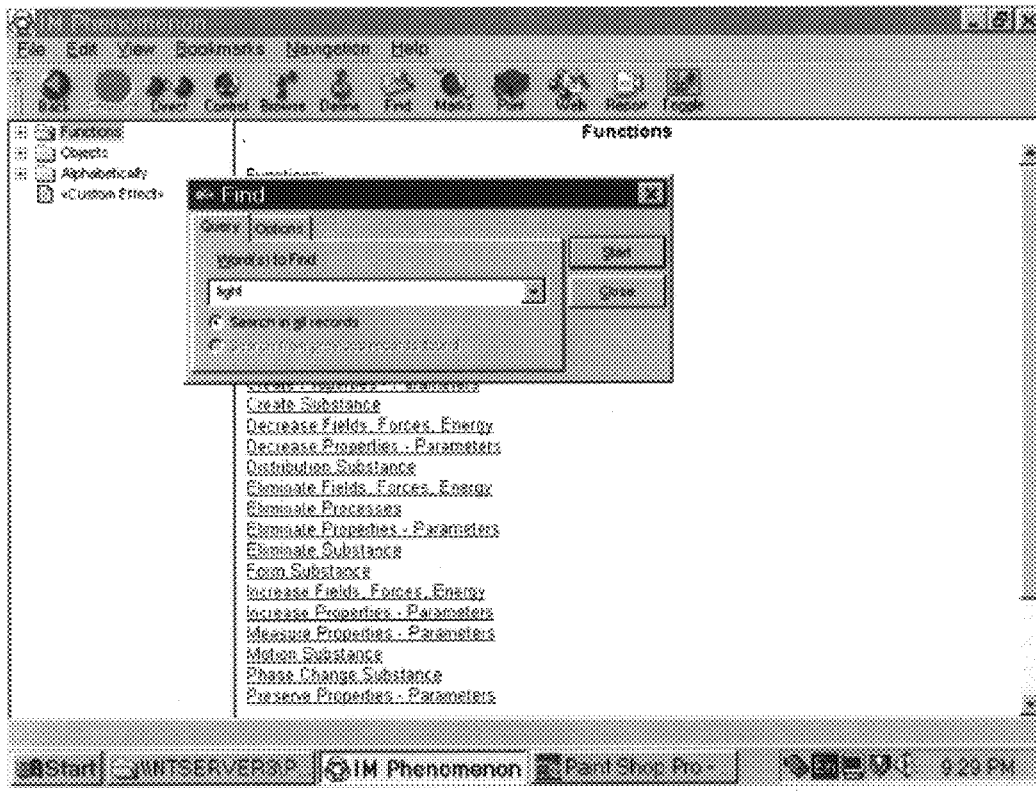

FIG. 22 is a display of the start of the find routine.

Figure 23:
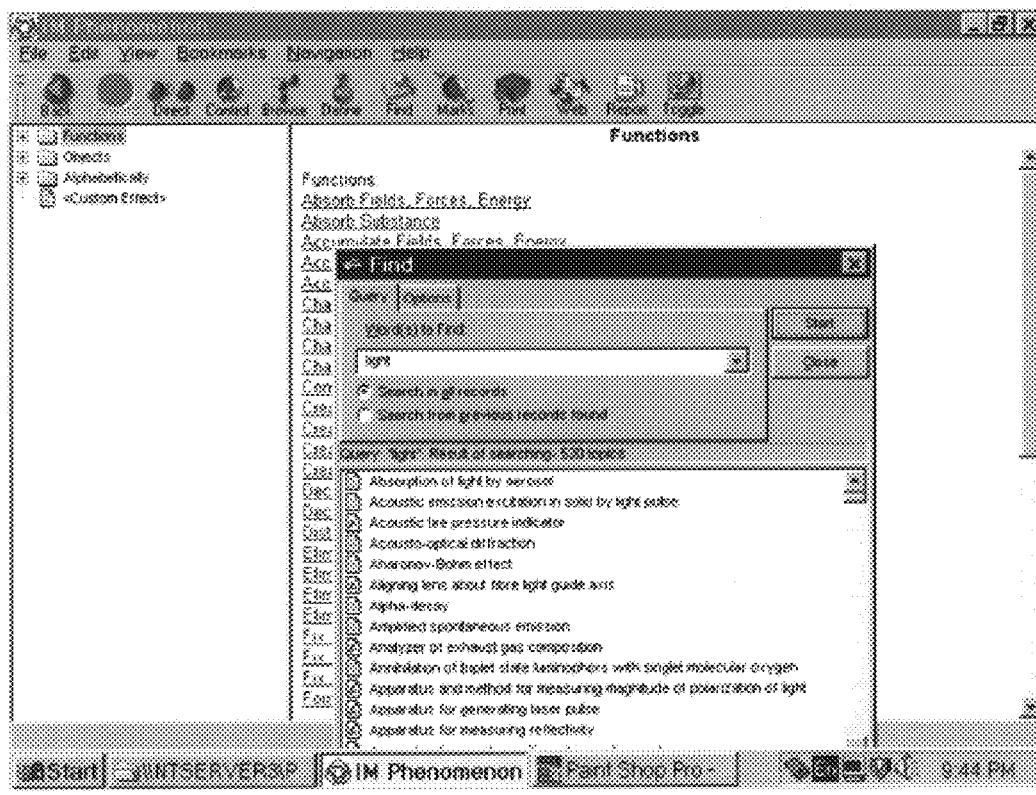

FIG. 23 is a display of the FIG. 22 when the key word right arrow is selected.

Figure 24:
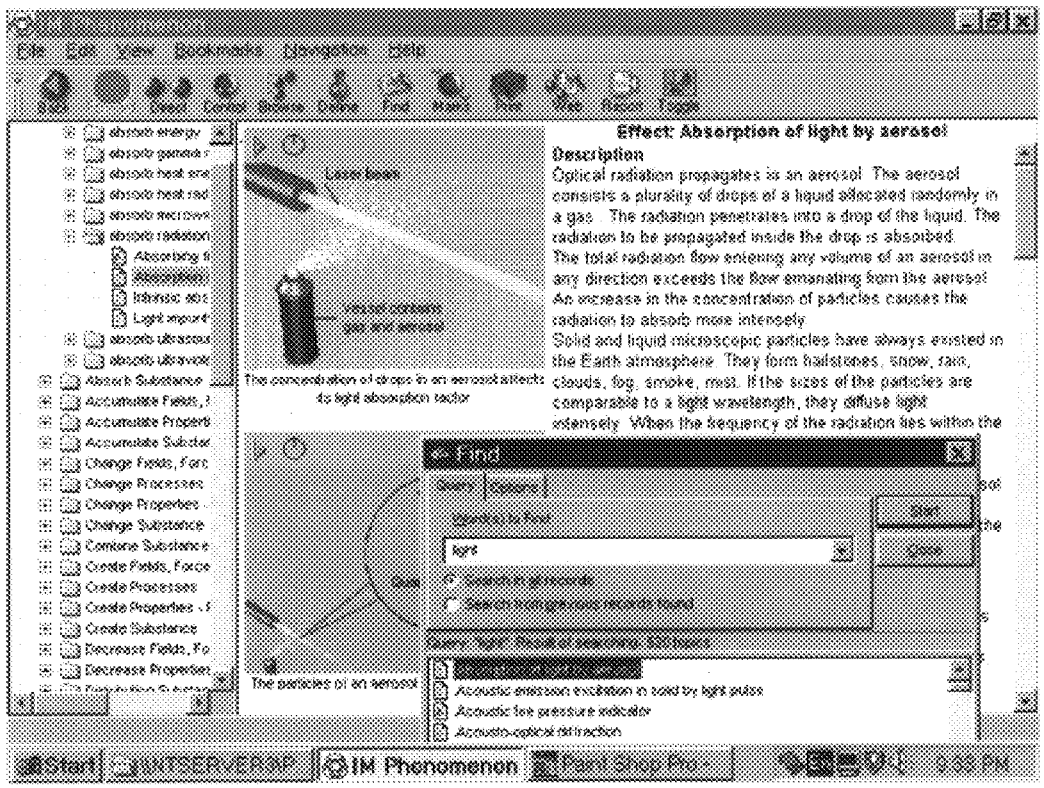

FIG. 24 is a display of FIG. 23 when the absorption of light by aerosol is selected.

Figure 25:
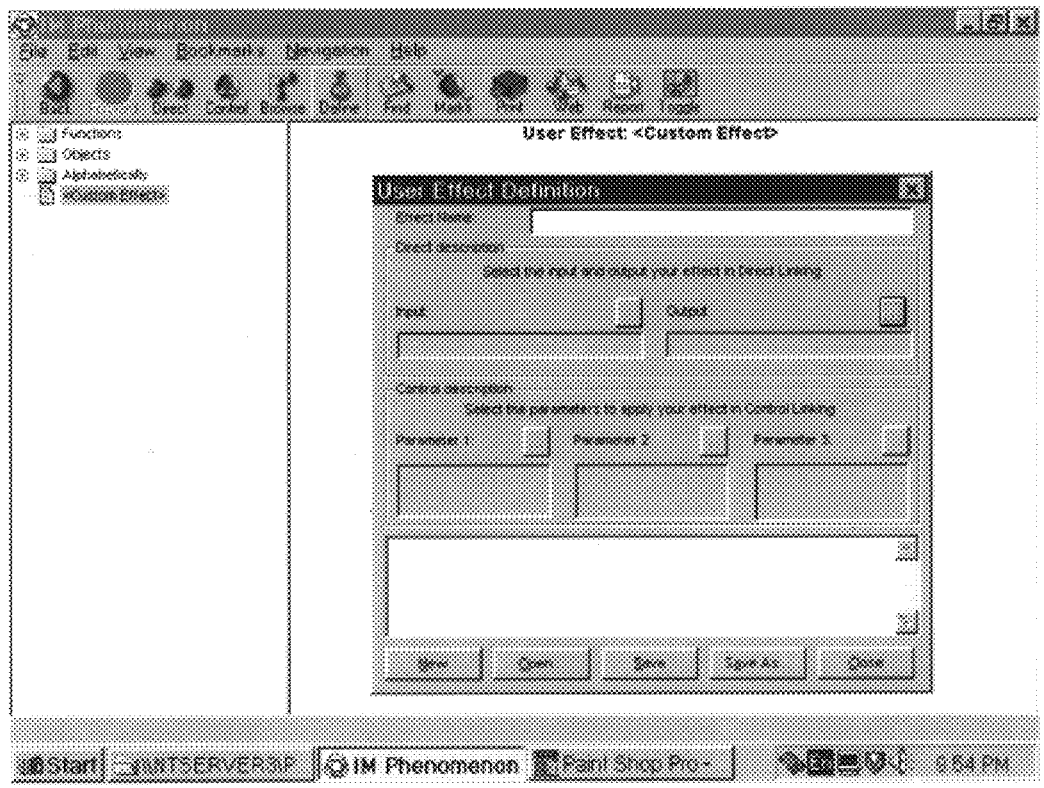

FIG. 25 is a display of the start of the define routine.

Figure 26:
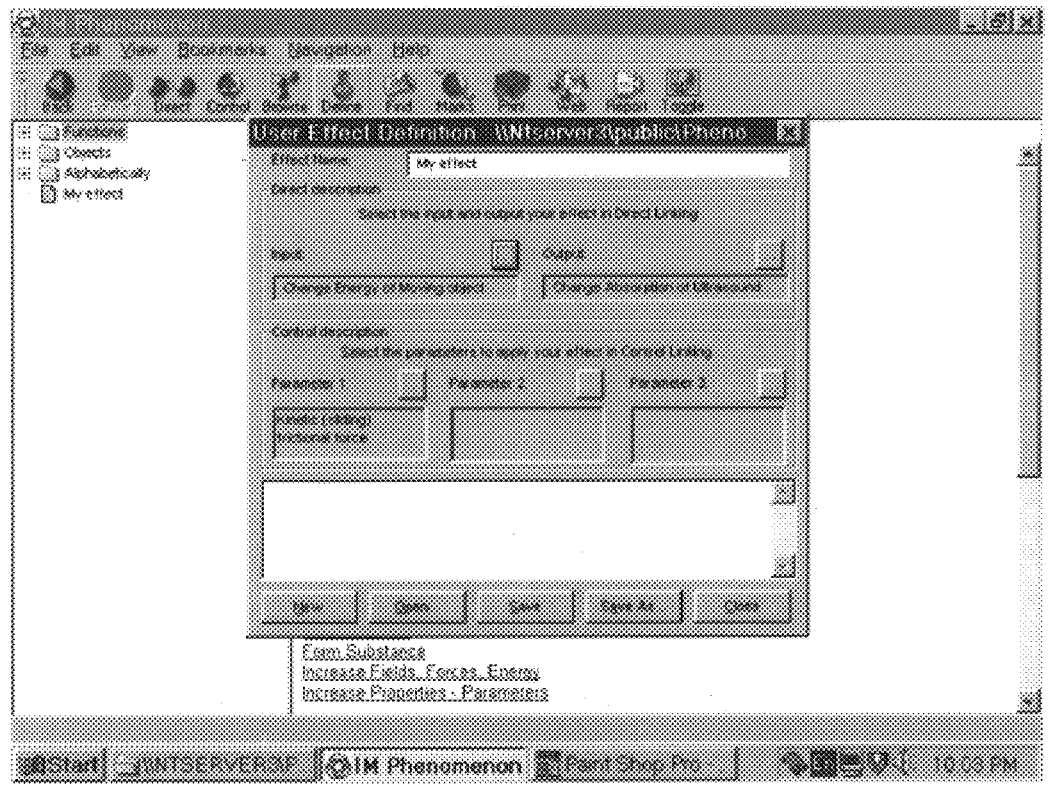

FIG. 26 is a display of FIG. 25 when the effect name is completed and one parameter is selected.

Figure 27:
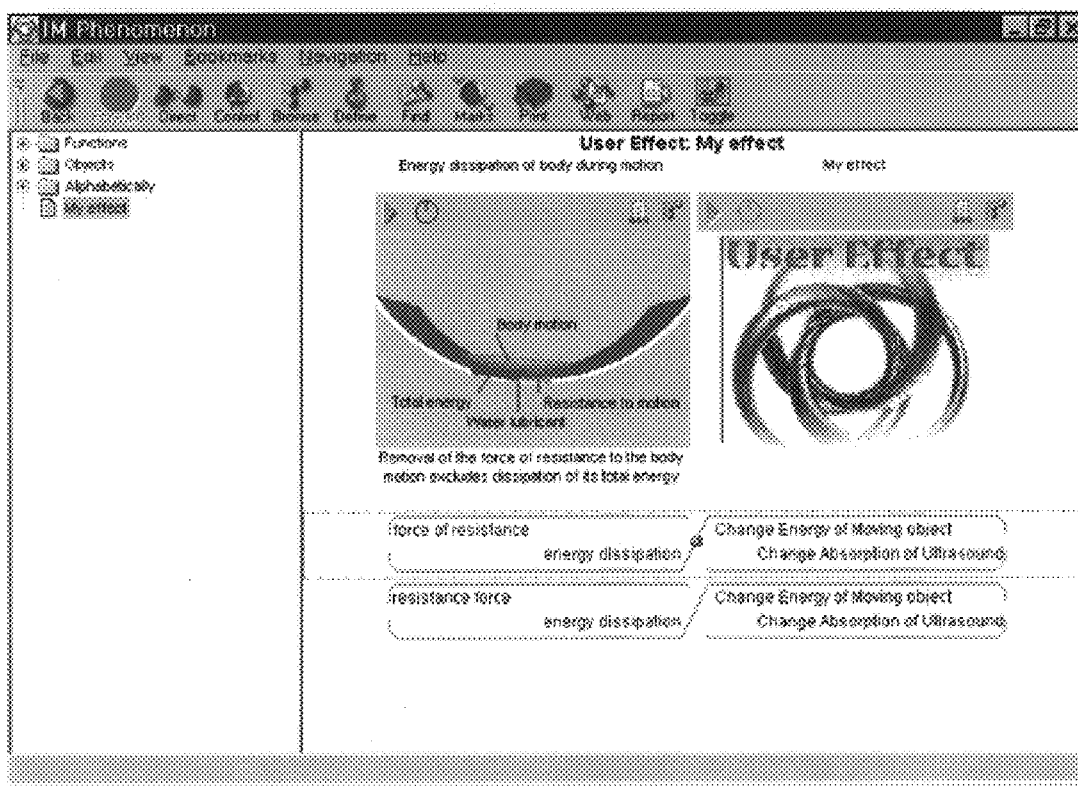

FIG. 27 is a display of FIG. 25 when the direct linking mode is selected.

Figure 28:
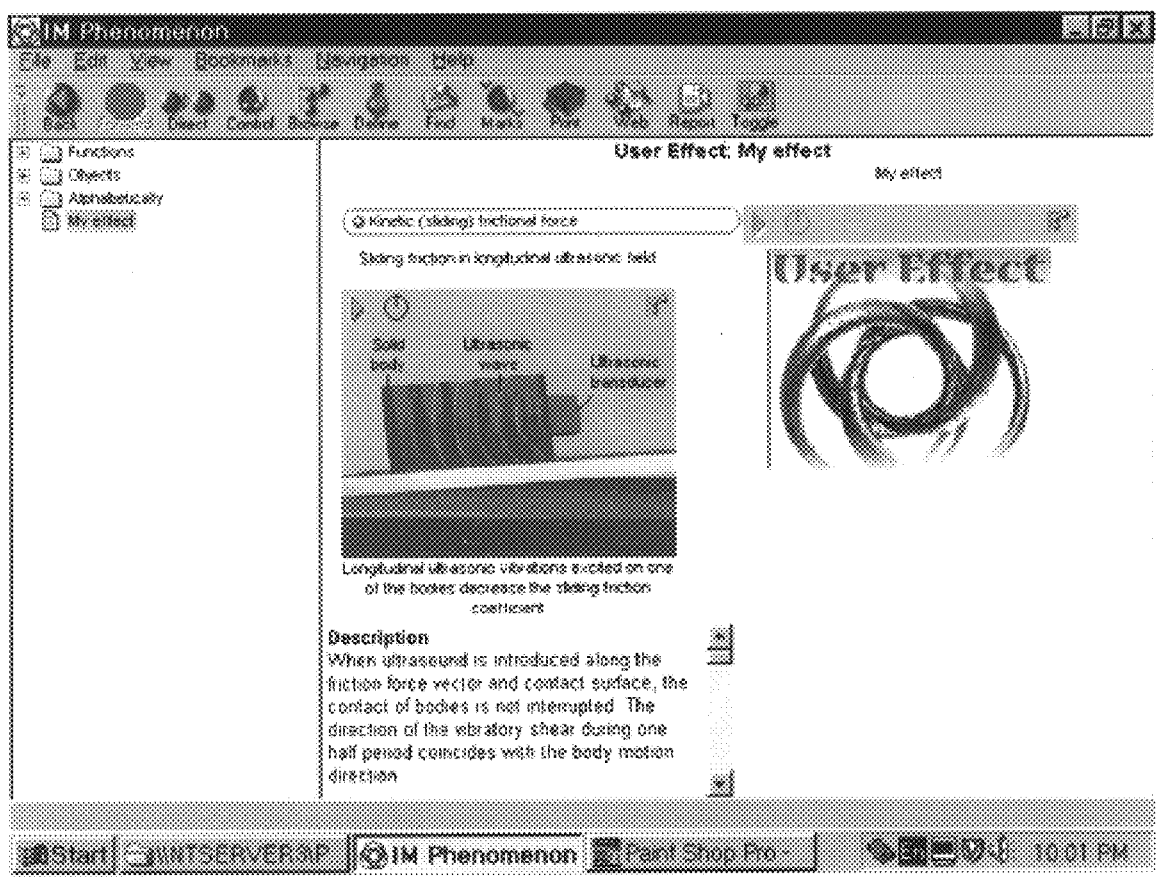

FIG. 28 is a display of FIG. 25 when control linking mode is selected and the listed parameter is selected.

Figure 1:
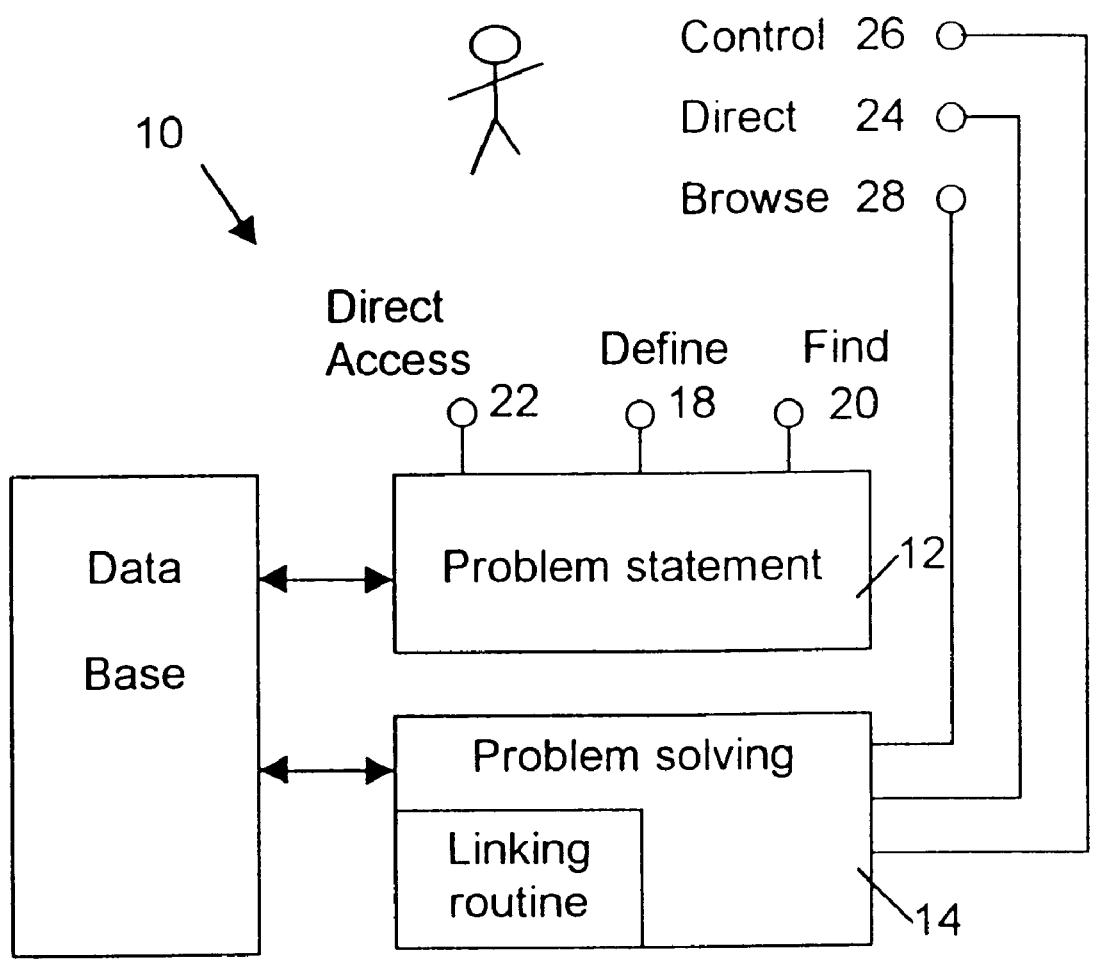
FIG. 1 is conceptual overview of exemplary embodiment of the CES according to the principles of the present invention.
Figure 2:
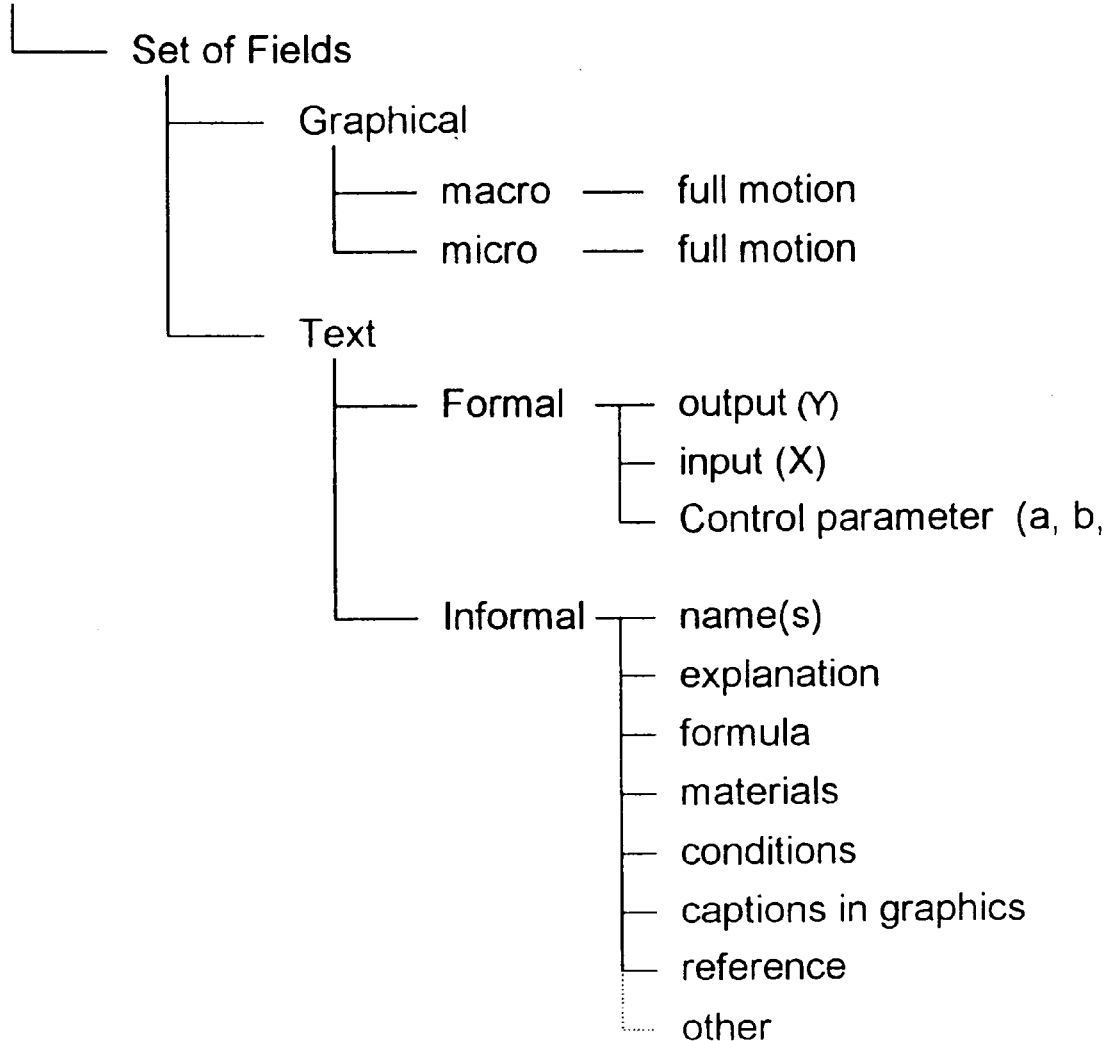
FIG. 2 is a graphical representation of the fields of each concept component of the CES of FIG. 1.

With reference to FIGS. 1–13, an exemplary embodiment of the technical concept engineering system according to principles of the present invention includes a computer based information processing system, a conceptual block diagrammed overview of which is shown in FIG. 1. The concept engineering system (CES) 10 includes two main stages; the problem statement stage 12 and the problem solving stage 14. A user can input data and control methods of problem statement and modes of problem solving sequentially, or move between stages 12 and 14 at any time to modify previously entered data, or enter new data at will. The computer based CES 10 includes a database 16 in which each entry is a unique engineering concept component that includes a set of fields, described below, that represent a physical or other effect from any domain of science and technology. For example, each engineering concept component entry can include 15 fields, or more, such as those shown in FIG. 2 and FIG. 6. Two main categories of fields include graphical fields and text fields. Graphical fields include a macro graphical field with full motion and a micro graphical field with fall motion. The text fields include formal type text fields that support linking routines, described below, and informal type text fields that convey information and support word or formula searching but do not support linking. Formal text fields include a component output (Y) field, an input field (x), and control parameter fields (a,b,c) and equivalents of any data entered, such as "x-ray" and "radiation in the x frequency band." The informal fields include names or titles of the engineering component, including synonyms or equivalent names or titles, word explanations pertaining to the concept component entry, mathematical formulas, materials, captions for graphical representations, references, conditions, advantages, and other entries desirable and useful to the user.

Figure 6:
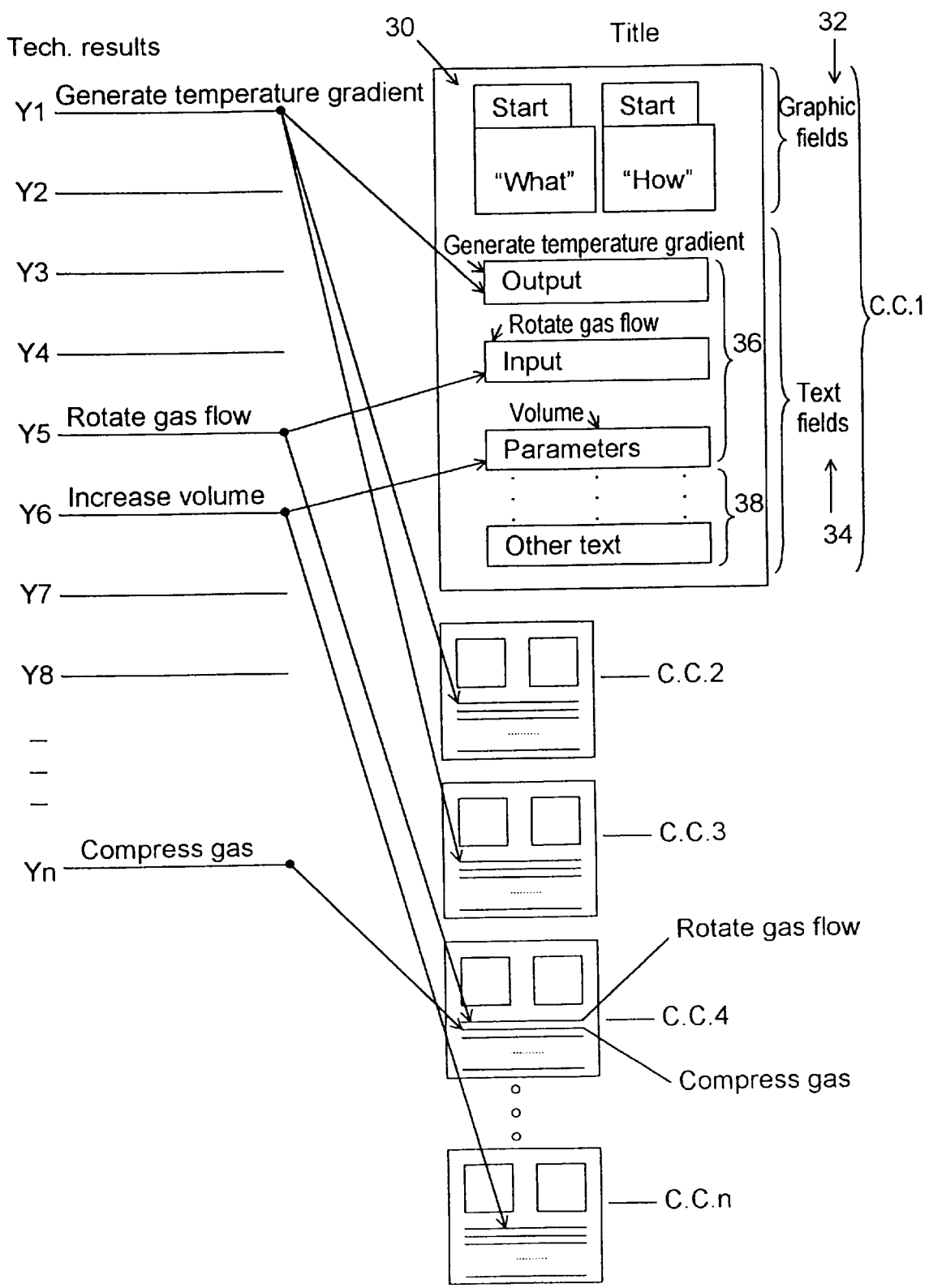
FIG. 6 is a conceptual and pictorial representation of the concept components CC1 . . . CCN and search routines.

With reference to FIG. 6, the upper right shows the main elements of a concept component display server 30 with graphic fields 32 and text fields 34, formal text fields 36 and informal text fields 38. Data for each concept component (CC1–CCN) field set (FIG. 2) would be entered and stored in association with the specific CC identity, e.g., a unique 5-digit word. The CES includes the ability to search specific fields in all CC database entries. For example, if the user in direct access designates generate temperature gradient as the desired technical result, then the CES search routine will compare this technical result with the output fields of CC1, CC2 . . . CCN. The identity of those CC entries having "generate temperature gradient" or the equivalent technical result will be stored to form a list of CCs having the desired output.

The CES can form direct links between CCs by, for example, search the CC input fields for "rotate gas flow" and storing the identities in a list and searching the CC output fields for "rotate gas flow" and storing the resulting identities in a list 2. The CES then forms and stores the list of direct links search as the link between CC4 and CC1 of FIG. 6.

The CES also performs key word or combination of word searches of all text fields and stores the identities of those CCs in which the words are found and highlights those words when the specific CC is displayed.

With reference to FIG. 1, at session start up, the user has the option of initiating problem statement through a define routine 18 or a find routine 20, or the user can access the database directly through a direct access routine 22 that displays database concept component (CC) entries in one of three ways (see FIG. 5) selectable by the user: alphabetically by technical result (Y), alphabetically by the object of the technical result (Y), and alphabetically by the names or titles of the component entries. Selecting any single component entry will display the full concept component as described below and enable the user to use it as a problem statement, e.g., a desired technical result.

Figure 3:
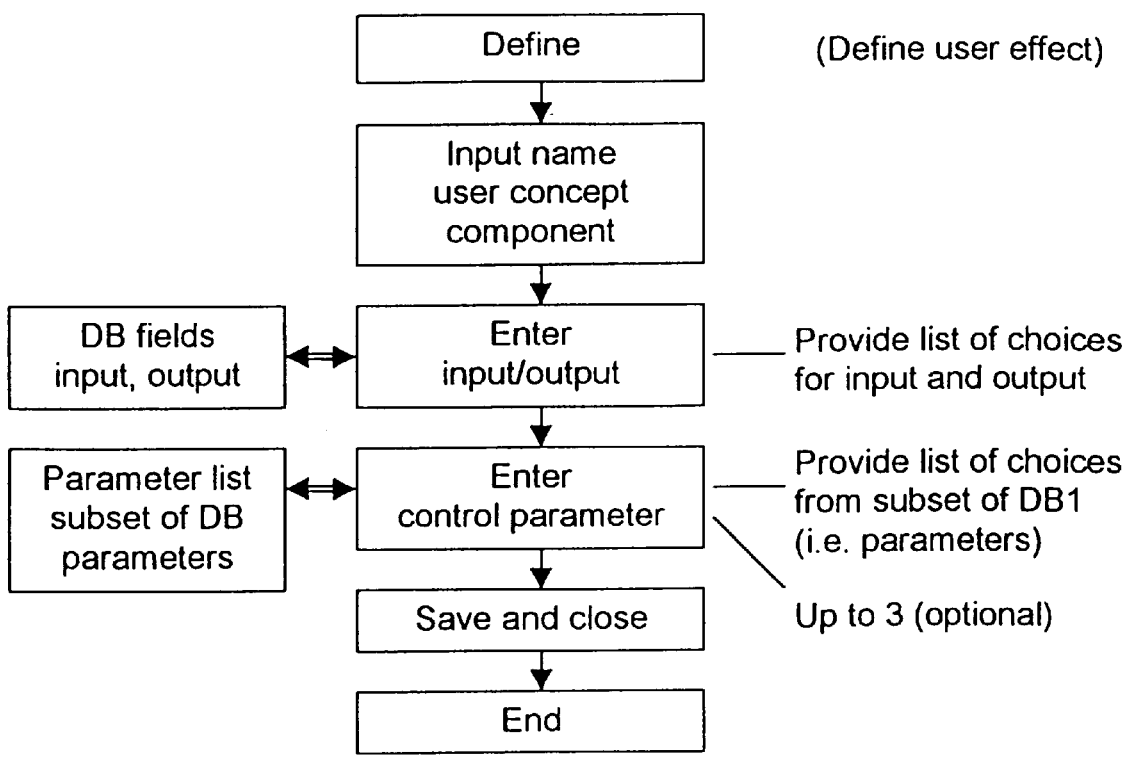
FIG. 3 is a flow diagram of the define routine.

The define routine 18, FIGS. 1 and 3, is selected when the user wants to define his/her own custom engineering concept component in order to improve it. When the define button is selected the CES displays a dialog box that prompts the user to enter data in the name field, to select an input (x) and an output (Y), and one or more control parameters (a, b, c). Once this is done, the user may save the user concept component data (user concept component) and close the define dialog box to complete defining the problem statement. Of course, the user can return to the define routine 18 at any time to modify the component, add data as desired, or to define another user concept component. When user concept component definition is completed, the CES enables certain selection capabilities, i.e., control linking and direct linking as described below.

Figure 4:
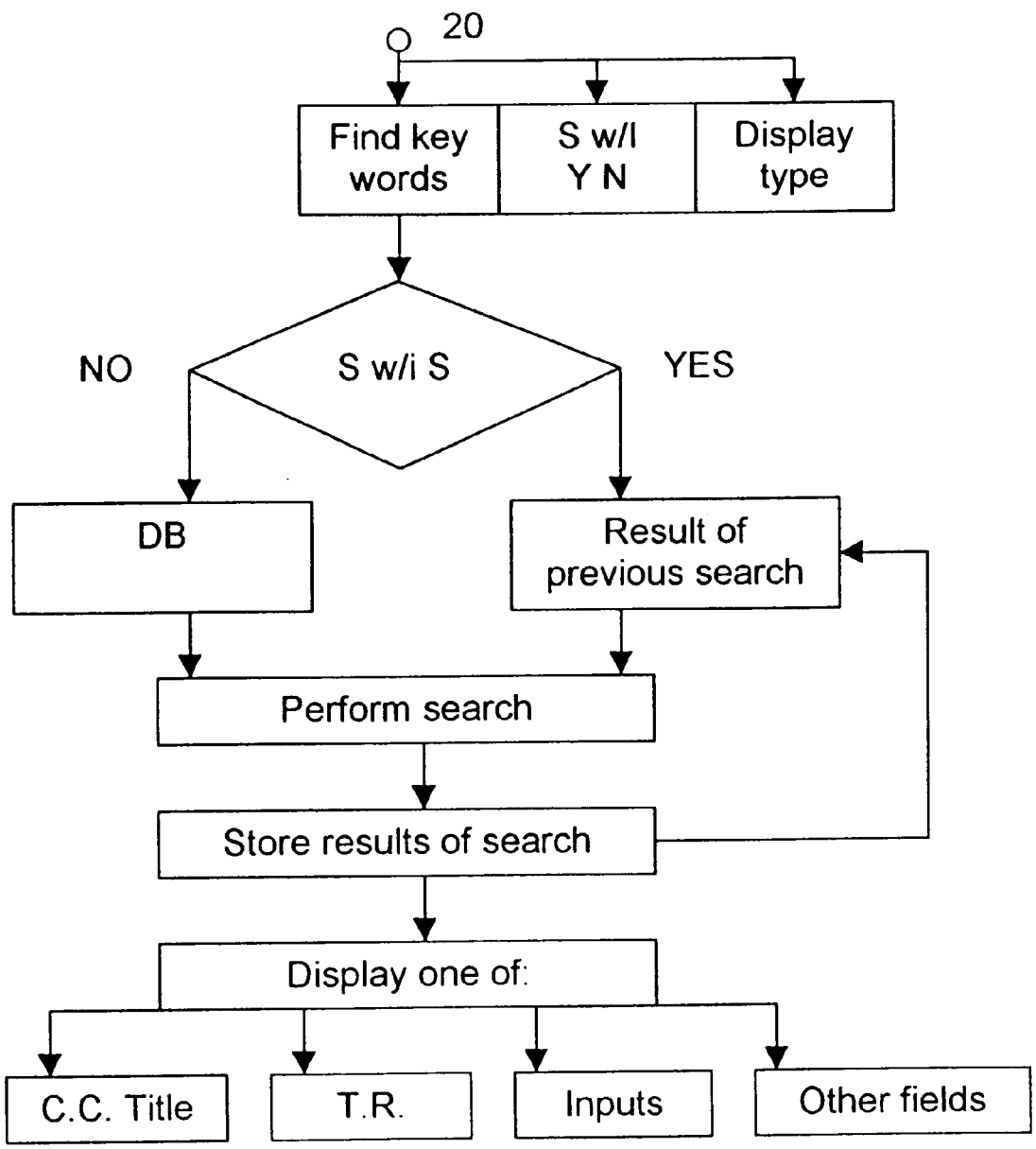
FIG. 4 is a flow diagram of the find routine.
Figure 5:
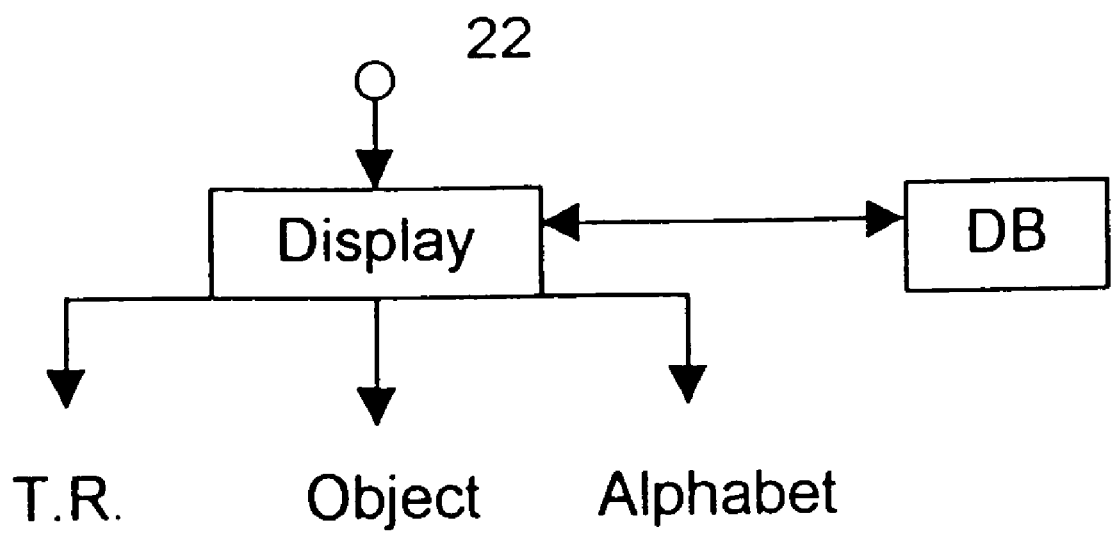
FIG. 5 is an overview of the session start routine.

Alternatively, the user may select the find routine 20, FIGS. 1 and 4 to start the problem as a key word or word combination. When the find button is selected the CES displays a dialog box that prompts the user to enter key words or combinations of key words for supporting a search process that displays all concept components that include those words or combinations of words entered by the user, in any respective field (see FIG. 4). The results of the search can be displayed as a list of component names or titles, a list of technical results (Y), inputs (x), or some other field listing. If desired, the user can elect to perform a search within their previous search results. When a search within a search (s w/i s) is selected, only the stored results of the immediately previous search are searched. Alternatively, when the user does not perform a search within a previous search, then the entire database of text fields are searched. Once the key words are entered, the find routine 20 shown in FIG. 4 begins. The database is accessed and key word(s) search performed. Results are stored and displayed as selected by the user. Once the user is satisfied with the search, the user can select one or more displayed search results and each entire identified concept component is displayed. The user can save this selection, and the selected and saved concept component becomes part of the problem statement for subsequent problem solving modes described below.

The exemplary three modes of problem solving are now described. It is preferred that one of the problem solving modes, e.g., direct linking, control linking, or browse serve as a default mode so that upon session start up, the CES is in a known problem solving mode. In one embodiment of the present invention, direct linking is selected as the default mode of problem solving. The user can select an alternate mode by selecting (clicking) on a mode button 24, 26, 28, in the tool bar.

Referring to FIG. 1, 2, 7A–D, direct linking problem solving mode first accesses the entire database of concept component entries and searches the output fields thereof. It is necessary for the operation of direct linking mode for the CES to know the desired technical result (Y) selected by the user either via the direct access method of problem statement mentioned above. Each concept component entry that includes the selected technical result (Y) in its output field is stored in a list 1 of possible concept components that may form part of an engineering concept system that solves the problem statement, how to produce Y.

Figure 7A:
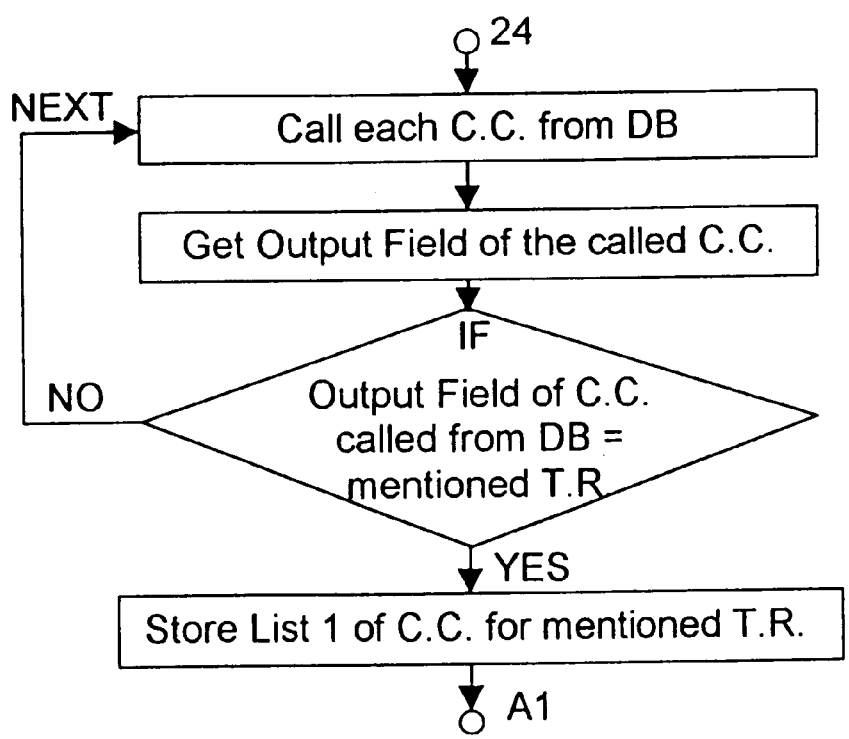
Figure 7B:
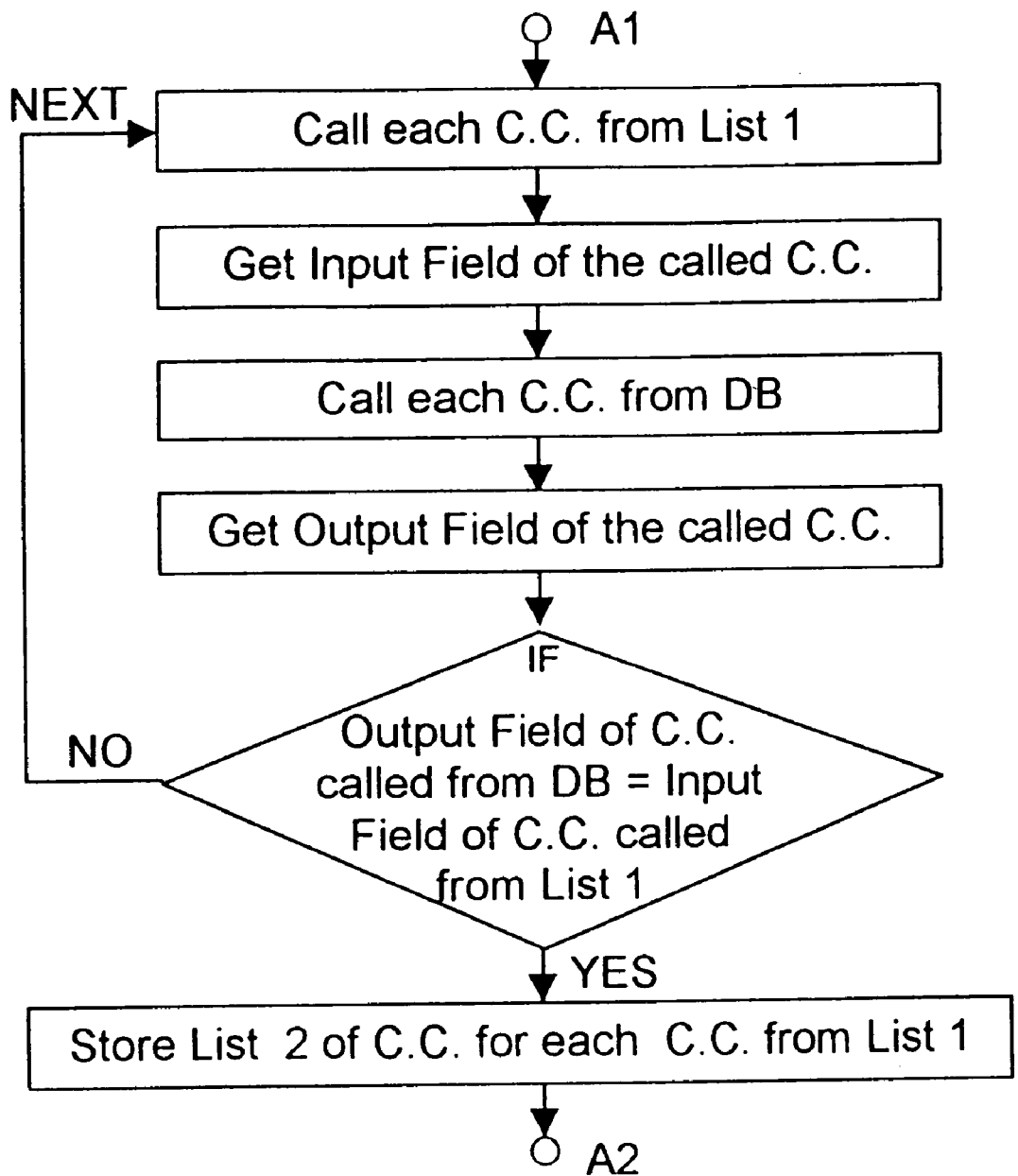
Figure 7C:
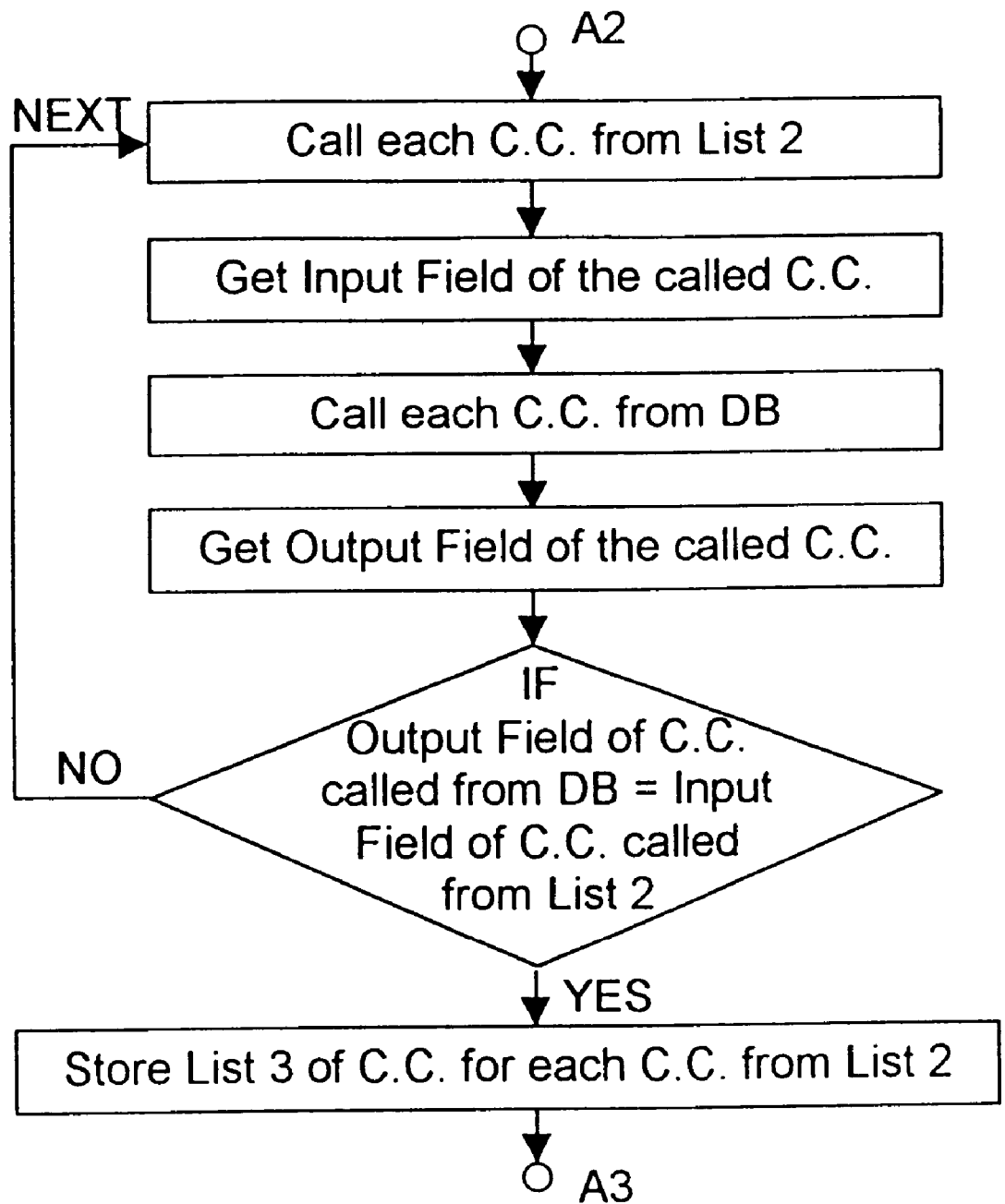
Figure 7D:
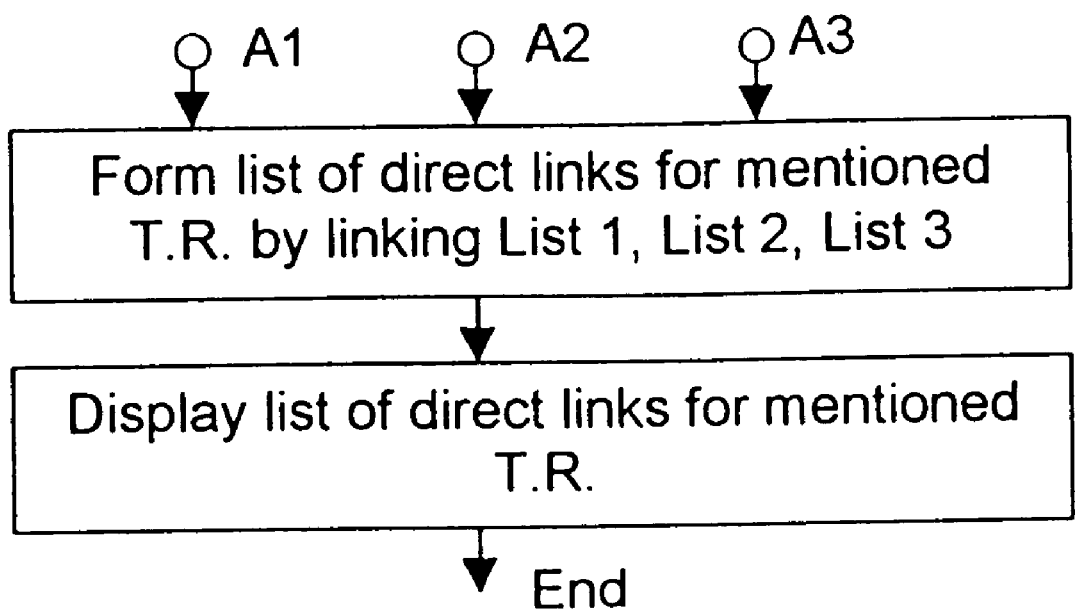

Next, as shown in FIG. 7B, the direct linking routine calls each entry from the stored list 1 and examines each input field thereof. The entire database is again accessed, entry by entry and the output fields of each entry examined to determine a match between the input field data of each list 1 entry (element of link) and the output field of each database entry. For those that match, the identity of the corresponding concept component is stored in list 2 (another element of link). As seen in FIG. 7C, the process is repeated for examining the inputs of each entry of list 2, searching for an output match throughout the database entries and storing the results in a third list, list 3 (another element of link), of concept components. The routine continues in FIG. 7D to reconfigure and combine the results of the three lists into linked inputs and output for various components that satisfy the statement $$X_2 \longrightarrow \boxed{f_2} \longrightarrow X_1 \longrightarrow \boxed{f_1} \longrightarrow Y$$

or $$X_3 \longrightarrow \boxed{f_3} \longrightarrow X_2 \longrightarrow \boxed{f_2} \longrightarrow X_1 \longrightarrow \boxed{f_1} \longrightarrow Y$$

as described above.

In addition, the results are displayed for the user in a list in graphical form as desired and enables the user to select any combination of interest. The CES then simultaneously displays the graphic representation (macro) corresponding to each linked concept component and, as described above, enables full motion upon actuation of a start button for any or all graphic representations. In this way, direct linking presents the user with a number of linked concept components that conceptually interact with one another to form a conceptual engineering system that solves the stated problem and provides the desired technical result (Y). It should be appreciated that since the direct linking routine selects concept components based on input and output fields and without regard to a particular scientific or engineering discipline, the user is presented with a range of potentially viable solutions both within and beyond their particular area of technical expertise, thereby stimulating innovation. In essence, the CES stimulates the user's creative capabilities by importing many technical ideas, theories, applications, and knowledge in a very short amount of time.

If the user develops the problem statement with the define routine, then the direct linking problem solving mode routine can be implemented as shown in FIG. 8A–D. Note that the search and match sequences can be the same as those described with respect to FIGS. 7A–D. However, the CES searches the output fields of the called up database entries and identifies matches with the input (x) field data selected by the user (see FIG. 3). The concept components that include a match are stored in a list 1. The search routine is repeated to store list 2 (FIG. 8B). The direct linking routine then links and organizes the lists of C2, C1 and user concept components such as:

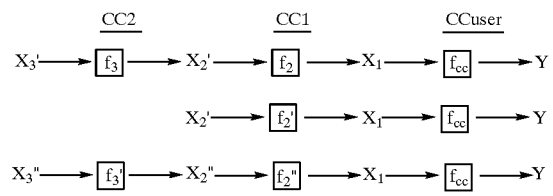

The problem solving direct linking mode routine, starting from the find problem statement is shown in FIGS. 9A–C. Each database entry is called in turn and the data from its output field is examined and compared with the input field of the concept component found by the find routine described above. The identity of matched components is stored as list 1. In FIG. 9B, each list 1 entry is examined and its input data extracted. Subsequently, the output fields of each database entry are obtained and compared with the input fields of list 1 concept components. Those entries that match have their identity stored in list 2. In FIG. 9C, lists 1 and 2 are applied to a subroutine that forms a list of direct links for the problem statement found components, list 1 and list 2 components. The CES displays these linked combinations as possible system solutions, such as:

$$X_3 \longrightarrow \boxed{f_3} \longrightarrow X_2 \longrightarrow \boxed{f_2} \longrightarrow X_1 \longrightarrow \boxed{f_1} \longrightarrow Y$$

$$X_2' \longrightarrow \boxed{f_2'} \longrightarrow X_1' \longrightarrow \boxed{f_1'} \longrightarrow Y$$

Where $f_1$ is the result of the "find" routine.

The control linking mode from the find method of problem statement can be seen in FIGS. 11 A–B. Each concept component is called and its output field searched for a match with each control parameter of the system found concept component, that is the result of the find routine. Matching concept component identities are stored as list 1 for each control parameter. Thereafter, the system forms a list of control links for the found concept component by linking the found concept component parameters with those in the stored list 1. The list of control links is then stored. Next, the system enables the user to select (click on) any displayed link to pull up the entire concept component and its user viewable fields. If desired, the first control link in the list could come up as a default.

The control linking problem solving mode routine starting from the define problem statement method is shown in FIGS. 12A–B. The routine is similar to that of FIGS. 11A–B, except that the output field data is compared for match with the control parameters entered by the user (see FIG. 3). The system displays a list of control links and enables the user to select any requested control link (see FIG. 21).

The Browse mode, started from the direct access method of problem statement is shown in FIG. 10. The browse subroutine accesses and examines each output field of each concept component. If the output field data matches the desired technical result identified in the direct access problem statement, then the identity of the concept component will be stored in a list of components each of which has an output equivalent to the technical result identified by the user. The identities of the matched components are stored in a list and displayed under or in association with the problem statement technical result. The user selects (clicks on) any of the listed concept components and the full concept component with all user visible fields will be displayed as stated above.

The control linking mode starting from the direct access problem statement is shown in FIGS. 13A–C. The output field data of each concept component database entry is examined and compared with the desired technical result selected by the user during the direct access routine. The identity of those components that match are stored in list 1. In FIG. 13B, the control parameters of each entry of list 1 is compared with the control parameters of each database entry and those concept component identities that have matching control parameters are stored as list 2. In FIG. 13C, the system forms a list of control links by linking Lists 1 and 2 for the desired technical result. The list of control links is stored. The display initially includes the concept component having the selected technical result and a list of its control parameters. The user selects a control parameter and the first entry of the linked concept component for controlling that parameter is displayed. The user can select other links for display. Each display includes a graphics (full motion if start button pressed) and word description of the desired technical result and a graphics (full motion) and a word description of the selected and linked concept component that can control the specific parameter of the technical result component under analysis. In this way, the user is presented with a number of concept components that can modify or improve the technical result (Y) of the component selected by the user during the direct access routine.

FIGS. 14–28 depict one example of the graphical user interface (GUI) of a engineering concept component system according to one illustrative embodiment of the present invention. FIG. 14 illustrates a top level screen as seen by a user of the CES after system start-up. The GUI includes a number of user selectable buttons in a menu bar. These buttons include a Direct button that activates direct linking mode, a Control button, that activates control linking mode, and a Browse button that actives browse mode. The buttons also include a Define button that initiates the define routine, a Find button that initiates the find routine, as well as other buttons whose function should be apparent to those skilled in the art. See FIG. 1.

As shown in FIG. 14, when the user's pointing device is positioned over any one of the Functions, Objects, Alphabetically, or User Customized folders, a corresponding alphabetically arranged list of Functions, Objects, database entry titles or names, or user custom effects, are respectively displayed on a right hand portion of the display.

FIGS. 15,16, and 17, illustrate a lower level screen that is presented to the user when one of the Functions, Objects, or Alphabetically folders is pointed to and selected by a user. As can be seen by comparing FIGS. 15 and 16, the displayed technical results in both the Functions folder and the Objects folder include the same items, but expressed in two alternative ways, i.e., "functions" are expressed as a verb then an object of the verb, whereas "objects" are expressed as an object (for instance a material, a field, a process, a parameter) and a verb that acts in some way upon the object. This technique aids the user in searching for and finding the precise technical result of interest. FIG. 17 shows the alphabetical listing of names or titles of all concept components in the database.

FIGS. 18–28 depict various screens that would be seen by a user in attempting to solve a particular problem, for example, filtering sunlight. As shown in FIG. 18, the user has selected the direct access mode of problem statement definition in Browse mode, as the user is perhaps uncertain as to how to best express their problem. After examining the function sub-folder "absorb radiation" from the Absorb Field, Forces, Energy folder, the user determines that the concept component "Absorption of light by aerosol" looks intriguing. As depicted in FIG. 18, when the user first positions the pointing device, e.g., mouse pointer, over a particular concept component, a graphical representation of that concept component is briefly displayed for about 3 to 5 seconds, and then disappears. Accordingly, the user specifically selects Absorption of light by aerosol. As can be seen in FIG. 18, after selection by the user, graphical representations of the selected effect, and a detailed written explanation of that selected effect are displayed in the right hand portion of the screen. The graphical representations of the selected effect include both a macro graphical representation that shows "what" the selected technical effect does, as well as a micro graphical representation that shows "how" the selected technical effect achieves a particular technical result. Although not visible in FIG. 18, each of the graphical representations is a motion-based graphical representation that can be viewed statically and dynamically, with motion-based viewing being repeatable as desired. This motion graphic capability helps to convey a technological appreciation of a given selected effect in a manner which is rarely possible with text based description alone. In addition, although not depicted in FIG. 18, further information, such as mathematical formula describing the effect, advantages of the effect, technical references and other informal field data further describing the effect are available to the user by scrolling down in a conventional manner.

If the user wants to consider various conceptual components that could produce the aerosol/light effect, then the user would select the direct linking mode. In this mode, the CES would investigate possible systems that could produce this effect, alone, or in combination with other systems.

FIG. 19 depicts a screen in which the user, after selecting the direct linking mode and absorb radiation from the Absorb Field, Forces, Energy folder, has specifically selected Absorption of light by aerosol. In such a situation, the user would select direct linking to investigate possible systems that could use this effect, alone, or in combination with other systems. The user can select direct linking by selecting the Direct button in the tool bar, for example.

Upon selection, and as depicted in FIG. 19, motion based macro graphical representations of the first directly linked effect is visually displayed on the left side of the link representation. In written terms, this graphical representation informs the user that an increase in the concentration of aerosol droplets increases light absorption by the aerosol, and that cavitation of a liquid can produce an aerosol. FIG. 19 also shows that there is more than one way to produce an aerosol, for example, by vapor condensation, and also shows that more than two effects can be directly linked by the CES to present potential solutions to the user. When the user selects a particular directly linked solution, that solution is graphically displayed (i.e., is brought to the foreground). As shown in FIG. 20, the other potential solutions can be viewed graphically by the user (statically or dynamically) by selecting on them to pull them to the foreground, one at a time.

If the user wants to improve the performance of the selected absorption by light effect, then the user selects the control link mode.

FIG. 21 depicts a screen in which the user, after selecting the control mode and absorb radiation from the Absorb Field, Forces, Energy folder. Accordingly, after selecting Absorption of light by aerosol, the user selects control linking (either before or after selection of the effect), for example, by selecting the Control button in the tool bar. As noted earlier, control linking is especially useful for improving a system or result, or eliminating harmful or wasteful side effects or by-products of a system by modulating characteristics of parameters effecting that system. As shown in FIG. 21, the user is informed that there are two ways of increasing light absorption by an aerosol. One of these is by changing the dimension of the aerosol particles, and the other is by changing the wavelength of radiation of the light input. As in other potential problem solutions, full motion graphical representations of the control linked effects, and an in depth written explanation are displayed to the user.

FIG. 22 illustrates a display screen that is presented to the user when the Find mode of problem analysis is selected by the user, for example, by selecting the Find button in the tool bar. The find mode may be used when the user has a vague idea (a broad key word) or a clear idea (a number of specific key words, perhaps as a Boolean combination) of their problem statement. As shown in FIG. 22, the user is presented with a Find dialog box in which the user is prompted to input the desired key word or combination of keywords, including logical combinations of key words (for example, AND, OR, NOT). As described previously, the user can search the entire database (e.g., Search in all records) or can refine their previous search results (e.g., Search from previous records found). As depicted in FIG. 23, after the user initiates the search routine, for example, by selecting the start button, a list of all entries including the selected key word(s) is displayed in a scrollable list portion of the dialog box. By selecting on a particular entry, the graphical representations (macro and micro) with full motion capability and written description of the selected entry are displayed to the user as shown in FIG. 24. Furthermore, as shown in FIG. 24, the selected keyword(s) is highlighted in the descriptive text of the displayed entry. In a manner similar to that of browsing technical results via direct access, a graphical representation of that result is briefly displayed for about 3 to 5 seconds and then disappears when the user positions their pointing device above a particular effect or phenomena.

FIG. 25 illustrates a display screen that is presented to the user when the Define mode of problem analysis is selected by the user, for example, by selecting the Define button in the tool bar. As noted previously, the Define mode can be used to define a user customized problem statement. As shown in FIG. 25, the user is presented with a User Effect Definition dialog box in which the user is prompted to input the desired name or title for the user's effect or user concept component. The user is also prompted to enter an input of the effect, an output of the effect, as well as any control parameters of the effect. The input, output, and parameters designated by the user are used as the input, output, and control parameters used to facilitate direct and control linking of the user's custom effect to other component entries in the database. As should be apparent, the user could only enter an input if direct linking were desired, and could only enter one or more control parameters if control linking were desired. As shown in FIG. 26, the user has input the name "My effect" as the name of title of their problem, and has selected inputs and outputs from a drop down list of database component entries that are displayed to the user when accessing those areas of the dialog box. After entering fields, the user can save and close their custom defined problem statement. Furthermore, once define, the user can investigate potential solutions to their problem statement by selecting either control linking, or direct linking, for example, using the Control and Direct buttons in the tool bar, respectively.

An illustrative example of a direct linking based solution to the user's custom define problem statement is illustrated in FIG. 27, while FIG. 28 illustrates a control linking based solution. As shown in FIGS. 27 and 28, graphical representations corresponding to directly linked and control linked component entries, respectively, are displayed along with text descriptions. By selecting on a particular entry, the graphical presentations (macro and micro) with full motion capability and written description of the respective components are displayed.

It should be understood that an embodiment of the system according to the principles of the present invention includes any suitable known digital computer system with application software storage medium, such as portable disk installed therein, or the application software can be stored or resident on the computer hard drive or networked and resident on a server, as desired. The digital computer system preferably includes a standard input data device (keyboard), printer, monitor for displaying screens of the type mentioned above, and any network connections as desired. It should also be understood that various changes and modifications can be made to the exemplary routines described and illustrated herein and additional features added to the exemplary embodiment and method disclosed herein without departing from the spirit and scope of the present invention.

We claim:

1. In a digital information processing system, a method of displaying data associated with one or more concept components (CC), each having the expression y=f(x), the method comprises the steps of:

defining a set of fields for each CC, designating a first subset of said fields as graphical fields, designating second subset of said fields that include an input (x) field and an output (y) field, entering and storing data in association with said first and second subsets of fields, selecting a CC for display by matching the data in one of the input (x) and output (y) fields with a predetermined technical result (y) or input action or cause (x) and, displaying the graphic information stored in association with the selected CC.

2. A method as set forth in claim 1 wherein the step of displaying includes a still representation of the graphic information and a full motion representation of the graphic information.

3. In a digital data processing system the method of displaying control parameter linked concept components (CC's) that can improve the output (Y) of a predetermined CC that can be represented by the expression Y=f(x), the method comprising:

defining a set of fields for each CC, designating a first subset of said fields as control parameters (a,b,c), designating a second subset of said fields that include an input (x) field and an output (y) field, entering and storing data in association with said first and second subsets of fields, selecting at least one CC for display by matching the information in the output (y) fields with a predetermined CC parameter (a,b,c), and displaying descriptive information stored in association with the selected CC.

4. A method as set forth in claim 3 wherein the descriptive information includes a graphical representation of the selected CC.

5. A method as set forth in claim 4 wherein said graphical representation includes full motion and still graphical representations.

6. In a digital information processing system, the method of displaying direct linked concept components (CC's) that can conceptually serve as input (X) or output (Y) components of a concept engineering system represented by $X_n \rightarrow f_n\ X_{n-1} \rightarrow$ - - - $f \rightarrow Y$, the method comprising:

defining a set of fields for each CC, designating a first subset of said fields as graphical fields, designating a second subset of said fields that include an input (x) field and an output (y) field, entering and storing data in association with said first and second subsets of fields, selecting a predetermined CC with input $X_1$ and output Y, selecting at least one CC with input $X_2$ and output $X_1$ by matching the information in the output field of the selected CC with the information in the input field of the predetermined CC, and displaying during the same time period the graphical information in the first subset fields of the predetermined and selected CC's.

7. A method as set forth in claim 6 wherein the step of displaying includes a user selectively still representation and full motion representation of each graphical information of the respective CC.

8. A method as set forth in claim 7 wherein the step of displaying includes displaying a macro graphic and a micro graphic of the respective CC.

9. A method as set forth in claim 6 wherein the step of selecting includes selecting at least one additional CC with input $X_3$ and output $X_2$ by matching the information in the output field ($X_2$) of the additional selected CC with the input ($X_2$) of the selected CC, and displaying, during the same time period as first mentioned displaying step for the graphical information in the first subset fields of the predetermined CC and the selected CC, the information in the graphical field of the additional selected CC.

10. A method as set forth in claim 1 further displaying a list of CC titles and displaying for a brief period a still graphic representation of a CC in response to the computer mouse pointer designating the respective displayed title.

11. In a digital information processing system, the concept engineering method of displaying data representing one or more concept components (CC) each having the function Y=f(x) and each said CC including input, output, and at least one control parameter of a predetermined device or system, said method comprising a direct linking process for producing and displaying graphical CC combinations representing $X_2 \rightarrow f_2 \rightarrow X_1 \rightarrow f_1 \rightarrow Y$, and a control-linking process displaying one or more of control parameters (a, b, c) for one or more $f_2$ and $f_1$ and producing and subsequently displaying graphical representation of one or more CC's that control predetermined parameters of one or more parameters a, b, c for one or more of f1 and f2, and wherein useful combinations of CC representations are simultaneously displayed to stimulate the user to generate creative ideas and solutions to conceptual problems.

12. The method of claim 11 wherein each said graphical representation includes still and motion graphical representations of a predetermined physical effect.

13. The method of claim 12 wherein each said motion graphical representation comprises a macro graphic of what the physical effect is and a micro graphic of how the physical effect is produced.

14. The method of claim 11 wherein the method further comprises an initial problem statement process for identifying and storing one of the technical result (Y) desired by the user or the input (X) available to the user.

15. The method of claim 14 wherein said combinations of CC representations include at least one of the identified and stored (X) or (Y).

16. The method of claim 11 wherein said method further includes defining a set of fields for each CC, designating a first subset of said fields as graphical fields, designating second subset of said fields that include an input (x) field and an output (y) field, entering and storing data in association with said first and second subsets of fields, selecting a CC for display by matching the data in one of the input (x) and output (y) fields with a predetermined technical result (y) or input action or cause (x) and, displaying the graphic information stored in association with the selected CC.

17. A method according to claim 11 wherein said method further includes defining a set of fields for each CC, designating a first subset of said fields as control parameters (a,b,c), designating a second subset of said fields that include an input (x) field and an output (y) field, entering and storing data in association with said first and second subsets of fields, selecting at least one CC for display by matching the information in the output (y) fields with a predetermined CC parameter (a,b,c), and displaying descriptive information stored in association with the selected CC.

* * * * *

UNITED STATES PATENT AND TRADEMARK OFFICE
CERTIFICATE OF CORRECTION

PATENT NO. : 5,901,068
DATED : May 4, 1999
INVENTOR(S) : Leonid S. Batchilo, et al.

It is certified that error appears in the above-indentified patent and that said Letters Patent is hereby corrected as shown below:

In the abstract, line 8, change "$x_2 \rightarrow f_2 43\ x_1\ 43\ f_1 \rightarrow y$" to "$x_2 \rightarrow f_2 \rightarrow x_1 \rightarrow f_1 \rightarrow y$".

Signed and Sealed this

Twenty-fourth Day of August, 1999

Attest:

Q. TODD DICKINSON

*Attesting Officer*      *Acting Commissioner of Patents and Trademarks*